US008786130B1

(12) United States Patent
Mori et al.

(10) Patent No.: US 8,786,130 B1
(45) Date of Patent: Jul. 22, 2014

(54) METHOD OF FORMING AN ELECTROMECHANICAL POWER SWITCH FOR CONTROLLING POWER TO INTEGRATED CIRCUIT DEVICES AND RELATED DEVICES

(71) Applicant: INOSO, LLC, Austin, TX (US)

(72) Inventors: Kiyoshi Mori, San Antonio, TX (US); Ziep Tran, Austin, TX (US); Giang T. Dao, Milpitas, CA (US); Michael E. Ramon, Austin, TX (US)

(73) Assignee: INOSO, LLC, Austin, TX (US)

( * ) Notice: Subject to any disclaimer, the term of this patent is extended or adjusted under 35 U.S.C. 154(b) by 0 days.

(21) Appl. No.: 13/975,216

(22) Filed: Aug. 23, 2013

(51) Int. Cl.
*H02J 1/00* (2006.01)
*B81B 3/00* (2006.01)
*H03K 3/01* (2006.01)

(52) U.S. Cl.
USPC ............. 307/38; 438/136; 438/137; 438/173; 438/192; 327/534

(58) Field of Classification Search
CPC ............... H02J 1/00; B81B 3/00; H03K 3/01
USPC ............. 307/38; 327/534; 438/136–137, 173, 438/192
See application file for complete search history.

(56) References Cited

U.S. PATENT DOCUMENTS

| 6,833,597 | B2 | 12/2004 | Blasko, III |
| 7,288,824 | B2 * | 10/2007 | Partridge et al. ............. 257/414 |
| 7,618,837 | B2 | 11/2009 | Yan |
| 8,012,785 | B2 * | 9/2011 | Liang et al. ................ 438/50 |
| 8,466,760 | B2 | 6/2013 | Foster |
| 2010/0075481 | A1 | 3/2010 | Yang |
| 2010/0273286 | A1 | 10/2010 | Liang |
| 2011/0265574 | A1 | 11/2011 | Yang |

OTHER PUBLICATIONS

Henry and Nazhandali, "From Transistors to MEMS: Throughput-Aware Power Gating in CMOS Circuits", Design, Automation & Test in Europe Conference & Exhibition (DATE), 2010, pp. 130-135, Digital Object Identifier: 10.1109/DATE.2010.5457224.

Henry, Lyerly, Nazhandali, Fruehling, and Peroulis, "MEMS-Based Power Gating for Highly Scalable Periodic and Event-Driven Processing", 24th International Conference on VLSI Design, 2011, pp. 286-291, Digital Object Identifier: 10.1109/VLSID.2011.66.

(Continued)

*Primary Examiner* — Hal Kaplan
(74) *Attorney, Agent, or Firm* — Hayne and Boone, LLP

(57) ABSTRACT

A method of forming an electromechanical power switch for controlling power to integrated circuit (IC) devices and related devices. At least some of the illustrative embodiments are methods comprising forming at least one IC device on a front surface of a semiconductor substrate. The at least one IC device includes at least one circuit block and at least one power switch circuit. A dielectric layer is deposited on the IC device, and first and second electromechanical power switches are formed on the dielectric layer. The first power switch gates a voltage to the circuit block and the second power switch gates the voltage to the IC device. The first power switch is actuated by the power switch circuit, and the voltage to the circuit block is switched off. Alternatively, the second power switch is actuated by the power switch circuit, and the voltage to the IC device is switched off.

20 Claims, 22 Drawing Sheets

(56) References Cited

OTHER PUBLICATIONS

Henry, Srivastav, and Nazhandali, "A case for NEMS-based functional-unit power gating of low-power embedded microprocessors", 48th Design Automation Conference (DAC), 2011, pp. 872-877.

Shobak, Ghoneim, El Boghdady, Halawa, Iskander, and Anis, "Power gating of VLSI circuits using MEMS switches in low power applications", International Conference on Microelectronics (ICM), 2011, pp. 1-5, Digital Object Identifier: 10.1109/ICM.2011.6177407.

Kam, Chen, and Liu, "Reliable micro-electro-mechanical (MEM) switch design for ultra-low-power logic", IEEE International Reliability Physics Symposium (IRPS), 2013, pp. 6A.1.1-6A.1.5, Digital Object Identifier: 10.1109/IRPS.2013.6532044.

Henry and Nazhandali, "From Transistors to NEMS: Highly Efficient Power-Gating of CMOS Circuits", ACM Journal on Emerging Technologies in Computing Systems (JETC), Feb. 2012, vol. 8, Issue 1, Article No. 2, New York, NY, Digital Object Identifier: 10.1145/2093145.2093147.

Witvrouw, "CMOS-MEMS Integration: Why, How and What?", International Conference on Computer-Aided Design (ICCAD), 2006, pp. 826-827, Digital Object Identifier: 10.1109/ICCAD.2006.320128.

Raychowdhury, Il Kim, Peroulis, and Roy, "Integrated MEMS Switches for Leakage Control of Battery Operated Systems", IEEE Custom Integrated Circuits Conference (CICC), 2006, pp. 457-460, Digital Object Identifier: 10.1109/CICC.2006.320821.

Fedder, "Integrated MEMS in Conventional CMOS", Robotics Institute, 1997, Paper 309, http://repository.cmu.edu/robotics/309.

Fariborzi, Spencer, Karkare, Jeon, Nathanael, Wang, Chen, Kam, Pott, Liu, Alon, Stojanovic, and Markovic, "Analysis and demonstration of MEM-relay power gating", IEEE Custom Integrated Circuits Conference (CICC), 2010, pp. 1-4, Digital Object Identifier: 10.1109/CICC.2010.5617380.

Chong, Lee, Mitra, Howe, and Wong, "Integration of Nanoelectromechanical Relays With Silicon nMOS", IEEE Transactions on Electron Devices, 2012, pp. 255-258, vol. 59, Issue 1, Digital Object Identifier: 10.1109/TED.2011.2172946.

Chong, Lee, Parizi, Provine, Mitra, Howe, and Wong, "Integration of nanoelectromechanical (NEM) relays with silicon CMOS with functional CMOS-NEM circuit", IEEE International Electron Devices Meeting (IEDM), 2011, pp. 30.5.1-30.5.4, Digital Object Identifier: 10.1109/IEDM.2011.6131645.

Dadgour and Banerjee, "Design and Analysis of Hybrid NEMS-CMOS Circuits for Ultra Low-Power Applications", 44th ACM/IEEE Design Automation Conference (DAC), 2007, pp. 306-311.

Franke, Heck, King, and Howe, "Polycrystalline silicon-germanium films for integrated microsystems", Journal of Microelectromechanical Systems, 2003, pp. 160-171, vol. 12, Issue 2, Digital Object Identifier: 10.1109/JMEMS.2002.805051.

Gillot, Lagoutte, Charvet, Souchon, and Sillon, "Wafer Level Thin Film Encapsulation for MEMS", Conference on High Density Microsystem Design and Packaging and Component Failure Analysis, 2005, pp. 1-4, Digital Object Identifier: 10.1109/HDP.2005.251432.

Sugizaki, Nakao, Higuchi, Miyagi, Obata, Inoue, Endo, Shimooka, Kojima, Mori, and Shibata, "Novel wafer-level CSP for stacked MEMS / IC dies with hermetic sealing", 58th Electronic Components and Technology Conference (ECTC), 2008, pp. 811-816, Digital Object Identifier: 10.1109/ECTC.2008.4550068.

Witvrouw, Mehta, Verbist, Du Bois, Van Aerde, Ramos-Martos, Ceballos, Ragel, Mora, Lagos, Arias, Hinojosa, Spengler, Leinenbach, Fuchs, and Kronmuller, "Processing of MEMS gyroscopes on top of CMOS ICs", IEEE International Solid-State Circuits Conference (ISSCC), 2005, pp. 88-89, vol. 1, Digital Object Identifier: 10.1109/ISSCC.2005.1493882.

\* cited by examiner

METHOD OF FORMING AN ELECTROMECHANICAL POWER SWITCH FOR CONTROLLING POWER TO INTEGRATED CIRCUIT DEVICES AND RELATED DEVICES

BACKGROUND

1. Technical Field

The present invention generally relates to semiconductor devices. More particularly, the present invention relates to the integration of micro-electromechanical systems (MEMS) or nano-electromechanical systems (NEMS) with metal-oxide-semiconductor (MOS) devices and processes.

2. Description of the Related Art

The ever increasing demand of small, portable multifunctional electronic devices has led to the continued proliferation of smart phones, personal computing devices, personal audio devices (e.g., MP3 players), as well as biomedical and security devices. Such devices are expected to support and perform a greater number of increasingly complex and sophisticated functions while consuming less and less power. Such electronic devices rely on limited power sources (e.g., batteries and/or alternative energy harvesting systems) while providing ever-increasing processing capabilities and storage capacity.

In an attempt to reduce overall integrated circuit (IC) power consumption, various power gating techniques have been introduced to disable current flow to IC devices and circuitry when not in use, for example, when the device is in a non-operation mode so as to reduce standby consumed power. One common power gating technique includes using MOS transistors to switch connections to power or ground networks ON and OFF. The power gating technique can be understood with reference to FIG. 1, which shows a MOS power gate 102 coupled to a circuit block 104, where the MOS power gate 102 controls the power supplied to the circuit block 104 from a voltage supply ($V_{DD}$) by way of the gate control signal at an input of the MOS power gate 102. For example, in some cases, when the gate control signal is low (logic 0), the MOS power gate 102 is ON, and a virtual $V_{DD}$ coupled to the circuit block 104 is approximately equal to $V_{DD}$. Alternatively, in some cases, when the gate control signal is high (logic 1), the MOS power gate 102 is OFF, and the virtual $V_{DD}$ is approximately zero, thus effectively turning off of the power supplied to the circuit block 104. While the example of FIG. 1 shows the MOS power gate 102 connected between the circuit block 104 and the power network ($V_{DD}$), the MOS power gate 102 could also be coupled between the circuit block 104 and a ground connection ($V_{SS}$). Power gating of electronic devices becomes particularly important for devices that rely on limited power sources, spend a majority of their time in an OFF state or sleep mode (i.e., a non-operation mode), and which only operate on periodic and/or event-driven schedules, such as for example, motion-detecting security systems and biological implants which may only infrequently collect/analyze data or provide a drug release, among others.

The most common way to implement power gates has been through the use of MOS transistors, as illustrated in FIG. 1. However, as the minimum feature size of MOS devices has continuously decreased in an effort to meet stringent demands on device performance and power consumption, the OFF state leakage current has increased, and is rapidly approaching ON state current levels. This increased OFF state leakage, together with the fact that many electronic devices are spending a majority of their time in a non-operation mode, results in a dominant source of power consumption being the OFF state leakage occurring while the device is in a non-operation mode. Moreover, the voltage drop present in MOS devices while in an ON state can significantly degrade device performance, particularly in aggressively scaled and embedded IC devices.

SUMMARY

The problems noted above are solved in large part by a method of forming an electromechanical power switch for controlling power to integrated circuit (IC) devices and related devices. At least some of the illustrative embodiments are methods comprising providing a semiconductor substrate, and forming at least one IC device on a front surface of the semiconductor substrate. The at least one IC device includes at least one circuit block and at least one power switch circuit. A dielectric layer is deposited on the at least one IC device. A first electromechanical power switch and a second electromechanical power switch are formed on the dielectric layer. The first electromechanical power switch gates a voltage supply to the at least one circuit block and the second electromechanical power switch gates the voltage supply to the at least one IC device. In some embodiments, the first electromechanical power switch is actuated using the at least one power switch circuit. In response to actuating the first electromechanical power switch, the voltage supply to the at least one circuit block is switched off. In other embodiments, the second electromechanical power switch is actuated using the at least one power switch circuit. In response to actuating the second electromechanical power switch, the voltage supply to the at least one IC device is switched off.

Other illustrative embodiments are semiconductor devices comprising a semiconductor substrate, at least one IC device on a front surface of the semiconductor substrate, a dielectric layer on the at least one IC device, a first electromechanical power switch on the dielectric layer, and a second electromechanical power switch on the dielectric layer. The at least one IC device includes at least one circuit block and at least one power switch circuit. The first electromechanical power switch gates a voltage supply to the at least one circuit block and the second electromechanical power switch gates the voltage supply to the at least one IC device. In some embodiments, the first electromechanical power switch is actuated using the at least one power switch circuit, and the voltage supply to the at least one circuit block is switched off in response to actuation of the first electromechanical power switch. In other embodiments, the second electromechanical power switch is actuated using the at least one power switch circuit, and the voltage supply to the at least one IC device is switched off in response to actuation of the second electromechanical power switch.

Yet other illustrative embodiments are data processing systems comprising a system bus, at least one interface device in communication with the system bus, a power management unit in communication unit with the system bus, a first electromechanical power switch in communication with the power management unit, a second electromechanical power switch in communication with the power management unit, and at least one circuit block in communication with the first electromechanical power switch. The first electromechanical power switch gates a voltage supply to the at least one circuit block and the second electromechanical power switch gates the voltage supply to the data processing system. In some embodiments, the first electromechanical power switch is actuated by the power management unit, and the at least one circuit block is switched off in response to the first electromechanical power switch being actuated. In other embodiments, the second electromechanical power switch is actuated by the power management unit, and the data processing system is switched off in response to the second electromechanical power switch being actuated.

The above summary contains simplifications, generalizations and omissions of detail and is not intended to be a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

For a more detailed description of the various embodiments, the detailed written description can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
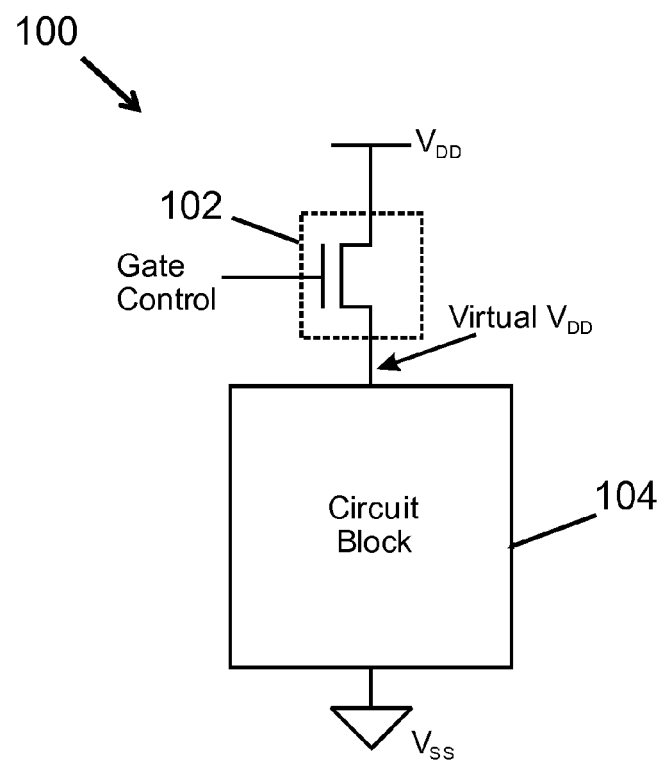
FIG. 1 shows a schematic diagram of a MOS power gate coupled to a circuit block.

The following discussion is directed to various embodiments which provide a method, a device, and a system for controlling power to an integrated circuit (IC) device. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections. Unless otherwise stated, when a layer is said to be "deposited over the substrate" or "formed over the substrate", it means that the layer is deposited or formed over any topography that already exists on the substrate.

The subject matter disclosed herein is directed to methods associated with formation of an electromechanical power switch, such as a micro-electromechanical systems (MEMS)-based switch as well as nano-electromechanical systems (NEMS)-based switch, for controlling power to an IC device, such as a complementary metal-oxide-semiconductor (CMOS) device, a bipolar-CMOS (BiCMOS) device, an n-type MOS (NMOS) device, a p-type (PMOS) device, and more generally for controlling power to any of a plurality of circuit blocks including at least one of the above-mentioned IC devices, such as a logic circuit, a central processing unit (CPU), a graphics processing unit (GPU), a microcontroller unit (MCU), a radio frequency (RF) circuit, an analog circuit, a memory, a memory controller, and an input/output (I/O) interface, among others. As used herein, the term "controlling power" (e.g., to an IC device and/or circuit block) is equivalently used to mean "gating a voltage supply" (e.g., to an IC device and/or circuit block). Thus, for example, an electromechanical switch that controls power to an IC device and/or circuit block is understood equivalently as an electromechanical switch that gates a voltage supply to the IC device and/or circuit block.

The potential performance gains afforded by MEMS/NEMS devices, including near infinite OFF state resistance, low ON state resistance afforded by ohmic metal-metal contacts, and the increased device density due to small device footprints have continued to drive significant interest in CMOS-MEMS/NEMS integration. Various CMOS-MEMS/NEMS integration schemes have been reported, including a hybrid fabrication approach as well as a variety of monolithic (i.e., single substrate) approaches. In the hybrid approach, CMOS and MEMS/NEMS ICs are each fabricated separately and bonded, and electrical connections between the two ICs are then made. The hybrid approach suffers from high assembly and packaging costs, as well as significant performance-limiting parasitic resistance, largely due to bond pads and bonding wires used for the interconnection between the separate CMOS and MEM/NEMS ICs. Moreover, using separate substrates for each of the CMOS and MEMS/NEMS ICs makes it very challenging to increase device density. Monolithic integration of CMOS and MEMS/NEMS ICs can improve overall device performance, for example, by reducing parasitic resistance, among others. Monolithic integration can also improve on-chip device density. Exemplary methods of monolithic integration include formation of CMOS devices using standard semiconductor processing techniques, followed by formation of a MEMS structure. However, the monolithic integration schemes studied thus far have largely been narrowly focused on specific types of MEMS devices (e.g., high aspect ratio MEMS devices, MEMS inertial sensors, etc.). Moreover, with regards to power gating techniques, the IC industry still heavily relies on leaky MOS-based power gates. Thus, an improved power gating method utilizing an electromechanical power gate (e.g., a MEMS and/or NEMS-based power gate) for controlling power to any of a plurality of circuit blocks is needed.

Figure 2A:
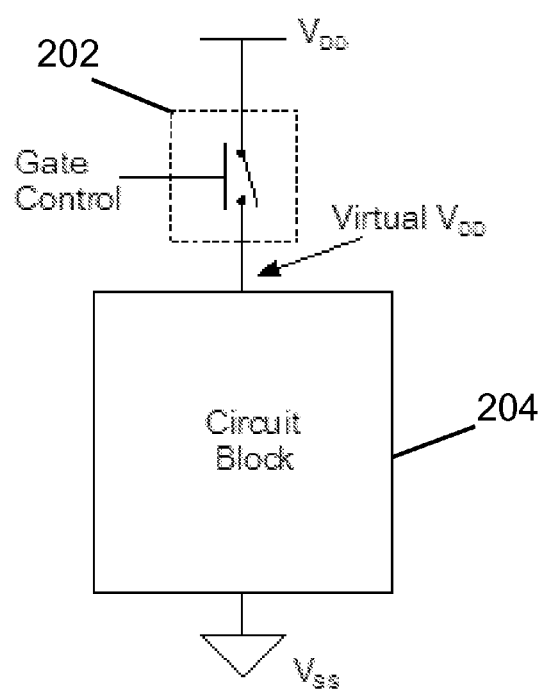
FIG. 2A shows a schematic diagram of an electromechanical power gate coupled to a circuit block in accordance with some embodiments.

As illustrated in FIG. 1, a power switch can be used to implement a power gating technique, wherein the standby consumed power is reduced by using power gating transistors to switch off inactive or non-operational IC devices or circuitry. Further, as traditional MOS-based power gates suffer from significant power consumption due to the OFF state leakage of the MOS device, there is a need for an alternative power gating technique that does not rely on leaky MOS-based power gates. Such an alternative exists in the form of using an electromechanical switch as the power gate, as illustrated in FIG. 2. Specifically, as shown in FIG. 2A, an electromechanical switch 202 is coupled to a circuit block 204, where the electromechanical switch 202 and the circuit block 204 are monolithically integrated on the same substrate. Moreover, the electromechanical switch 202 controls the power supplied to the circuit block 204 from the voltage supply ($V_{DD}$) by way of a gate control signal at an input of the electromechanical switch 202. In various embodiments, the circuit block 204 includes at least one of a logic circuit, a CPU, a GPU, an MCU, an RF circuit, an analog circuit, a memory, a memory controller, an I/O interface, a cache, a network interface, and/or subsystems of these devices/circuits. In other embodiments, the circuit block 204 includes any of a plurality of IC devices, such as a CMOS device, a BiCMOS device, an NMOS device, and/or a PMOS device, among others. The electromechanical switch 202 operates by actuation of a cantilever to close an air gap and provide contact between two metal electrodes. For purposes of this disclosure, the terms "electromechanical switch" or "electromechanical power gate" are meant to include MEMS-based switches and MEMS-based power gates, as well as NEMS-based switches and NEMS-based power gates. In an exemplary example, when the gate control signal is activated, the electromechanical switch 202 is ON, causing the two metal electrodes of the electromechanical switch 202 to contact one another, and a virtual $V_{DD}$ coupled to the circuit block 204 is approximately equal to $V_{DD}$. When in contact, the two metal electrodes provide a very low-resistance contact which minimizes parasitic voltage drop across the electromechanical switch 202. In an alternative embodiment, when the gate control signal is not activated, the electromechanical switch 202 is OFF, and the virtual $V_{DD}$ is zero. Moreover, when the electromechanical switch is in an OFF state, an air gap between the two metal electrodes provides a near infinite OFF-state resistance and thus essentially zero OFF-state current, which is unachievable with MOS devices, and thus completely turning off of the power supplied to the circuit block 204. While the example of FIG. 2A shows the electromechanical switch 202 between the circuit block 204 and the power network ($V_{DD}$), the electromechanical switch 202 could also be coupled between the circuit block 204 and a ground connection ($V_{SS}$).

Figure 2B:
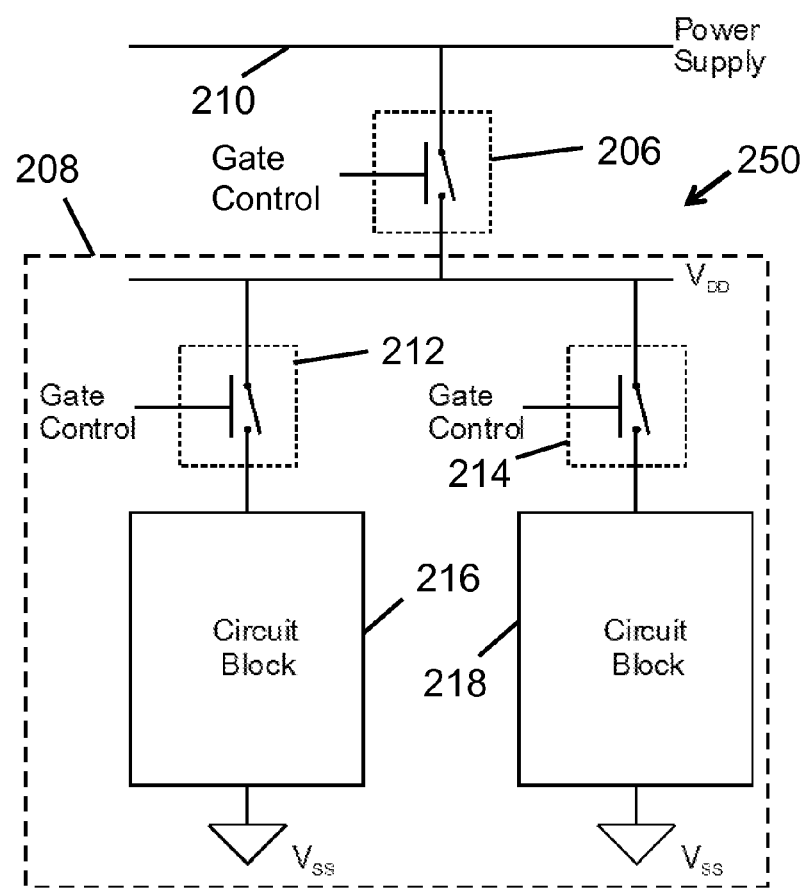
FIG. 2B shows a schematic diagram of an electromechanical power gate coupled to an integrated circuit (IC) device in accordance with some embodiments.

Expanding on the example of FIG. 2A, FIG. 2B illustrates a system 250 which shows an alternative embodiment where an electromechanical switch 206 is coupled to an IC device 208, where the electromechanical switch 206 and the IC device 208 are monolithically integrated on the same substrate. Moreover, the electromechanical switch 206 controls the power supplied to the IC device 208 from a power supply 210 by way of a gate control signal at an input of the electromechanical switch 206. In various embodiments, the IC device 208 includes at least one of a logic circuit, a CPU, a GPU, an MCU, an RF circuit, an analog circuit, a memory, a memory controller, an I/O interface, a cache, a network interface, and/or subsystems of these devices/circuits. In other embodiments, the IC device 208 includes any of a plurality of IC devices, such as a CMOS device, a BiCMOS device, an NMOS device, and/or a PMOS device, among others. Furthermore, the IC device 208 may include a very large scale integration (VLSI) chip, an ultra large scale integration (ULSI) chip, or a system-on-a-chip (SOC), among others. Moreover, the electromechanical switch 206 is coupled to a plurality of electromechanical switches 212, 214 within the IC device 208, where electromechanical switch 212 is coupled to a circuit block 216 and electromechanical switch 214 is coupled to a circuit block 218. The electromechanical switch 212 controls the power supplied to the circuit block 216 from the voltage supply ($V_{DD}$) by way of a gate control signal at an input of the electromechanical switch 212. Likewise, the electromechanical switch 214 controls the power supplied to the circuit block 218 from the voltage supply ($V_{DD}$) by way of a gate control signal at an input of the electromechanical switch 214. Thus, as shown in FIG. 2B, each of the plurality of electromechanical switches 212, 214 control the power supplied to individual circuit blocks within the IC device 208, and the electromechanical switch 206 controls the power supplied to the overall IC device 208. While the example of FIG. 2B discusses embodiments where the electromechanical switch 206 and the IC device 208 are monolithically integrated on the same substrate, those skilled in the art will recognize that some embodiments, for example using the hybrid approach, may be implemented where the electromechanical switch 206 and the IC device 208 are each fabricated separately and bonded, and electrical connections between the electromechanical switch 206 and the IC device 208 are subsequently made.

Figure 3:
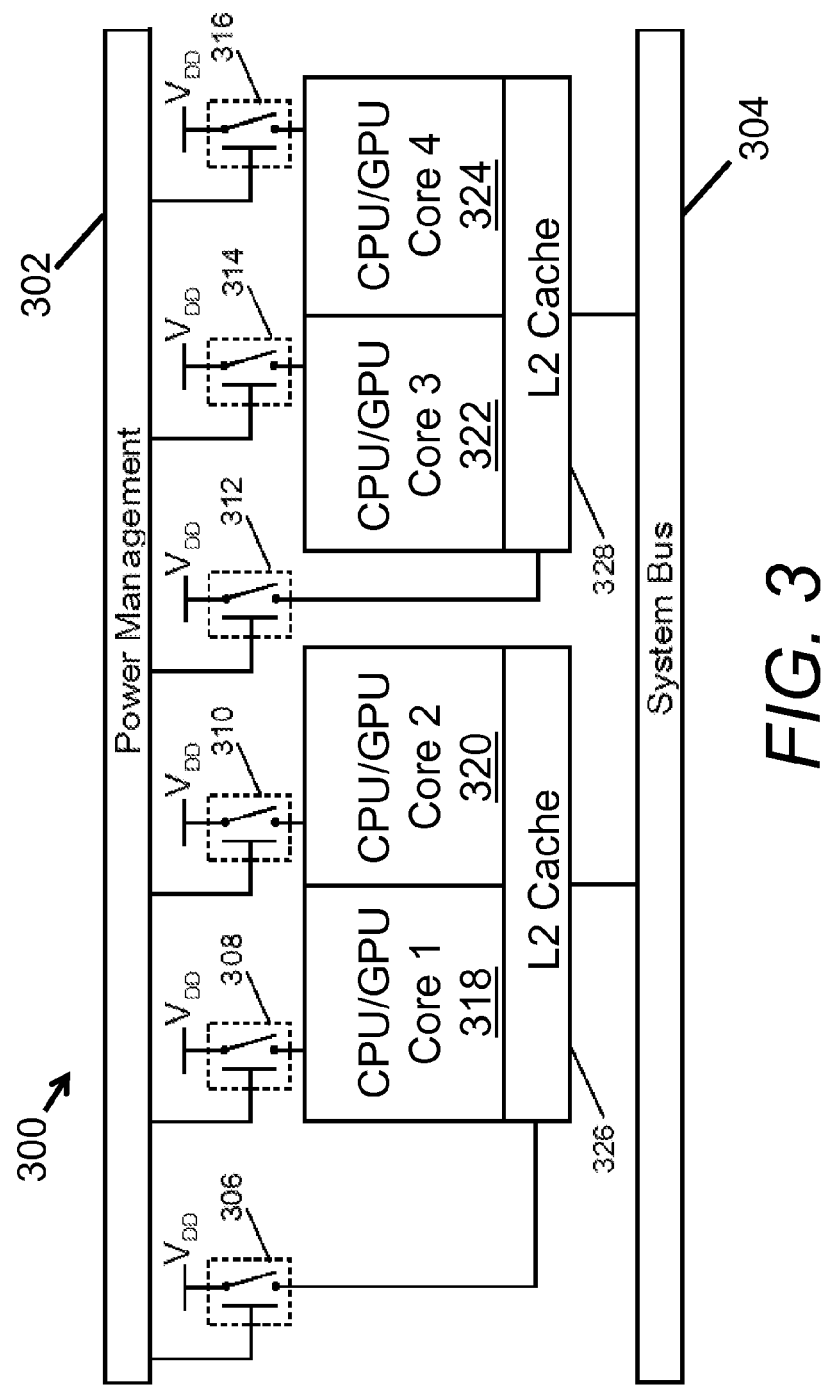
FIG. 3 illustrates a schematic representation of an exemplary CPU/GPU power management system according to one embodiment.

FIG. 3 depicts a schematic representation of an exemplary CPU/GPU power management system 300, which may be part of a data processing system as described below with reference to FIG. 4, and which is useful for implementing MEMS/NEMS-based power gating. The CPU/GPU power management system 300 includes a plurality of CPU/GPU cores 318, 320, 322, 324. CPU/GPU cores 318, 320 are coupled to L2 cache 326, and CPU/GPU cores 322, 324 are coupled to L2 cache 328. Each of the CPU/GPU cores 318, 320, 322, 324 may communicate with an external computer and/or data processing system by way of a system bus 304. As shown in FIG. 3, a voltage supply $V_{DD}$ connects to each of the CPU/GPU cores and L2 caches through a MEMS/NEMS-based electromechanical switch. Specifically, an electromechanical switch 306 is coupled to the L2 cache 326, an electromechanical switch 308 is coupled to the CPU/GPU core 318, an electromechanical switch 310 is coupled to the CPU/GPU core 320, an electromechanical switch 312 is coupled to the L2 cache 328, an electromechanical switch 314 is coupled to the CPU/GPU core 322, and an electromechanical switch 316 is coupled to the CPU/GPU core 324. In various embodiments, at least one of the electromechanical switches 306, 308, 310, 312, 314, 316 is monolithically integrated on the same substrate as the CPU/GPU core and/or L2 cache to which it is coupled. Activation (i.e., actuation) of each of the electromechanical switches 306, 308, 310, 312, 314, 316 is controlled by a power management unit 302. In some embodiments, the power management unit 302 includes a power switch circuit. The power switch circuit may include any of a plurality of IC devices, such as CMOS, BiCMOS, NMOS, and/or PMOS devices, among others. Further, in some embodiments, the power switch circuit is monolithically integrated on the same substrate as the electromechanical switch to which it is coupled. In various embodiments, power consumption within the CPU/GPU power management system 300 can be reduced by shutting off power to one or more of the CPU/GPU cores and/or L2 caches, for example, during periods of inactivity and/or non-operation. Illustratively, in response to a signal from the power management unit 302, one or more of the electromechanical switches 306, 308, 310, 312, 314, 316 can be actuated in such a way so as to turn off power to one or more of the CPU/GPU cores and/or L2 caches. In some embodiments, an entire CPU/GPU core is shut off by way of one of the electromechanical switches. In other embodiments, at least one CPU/GPU core internal component, such as an arithmetic logic unit (ALU), a control unit (CU), and/or a register, is shut off by way of one of the electromechanical switches. While FIG. 3 shows each of the electromechanical switches 306, 308, 310, 312, 314, 316 coupled between the voltage supply $V_{DD}$ and one of the CPU/GPU cores or L2 caches, one or more of the electromechanical switches 306, 308, 310, 312, 314, 316 could instead be coupled between a ground connection (not shown) and one of the CPU/GPU cores or L2 caches.

Figure 4:
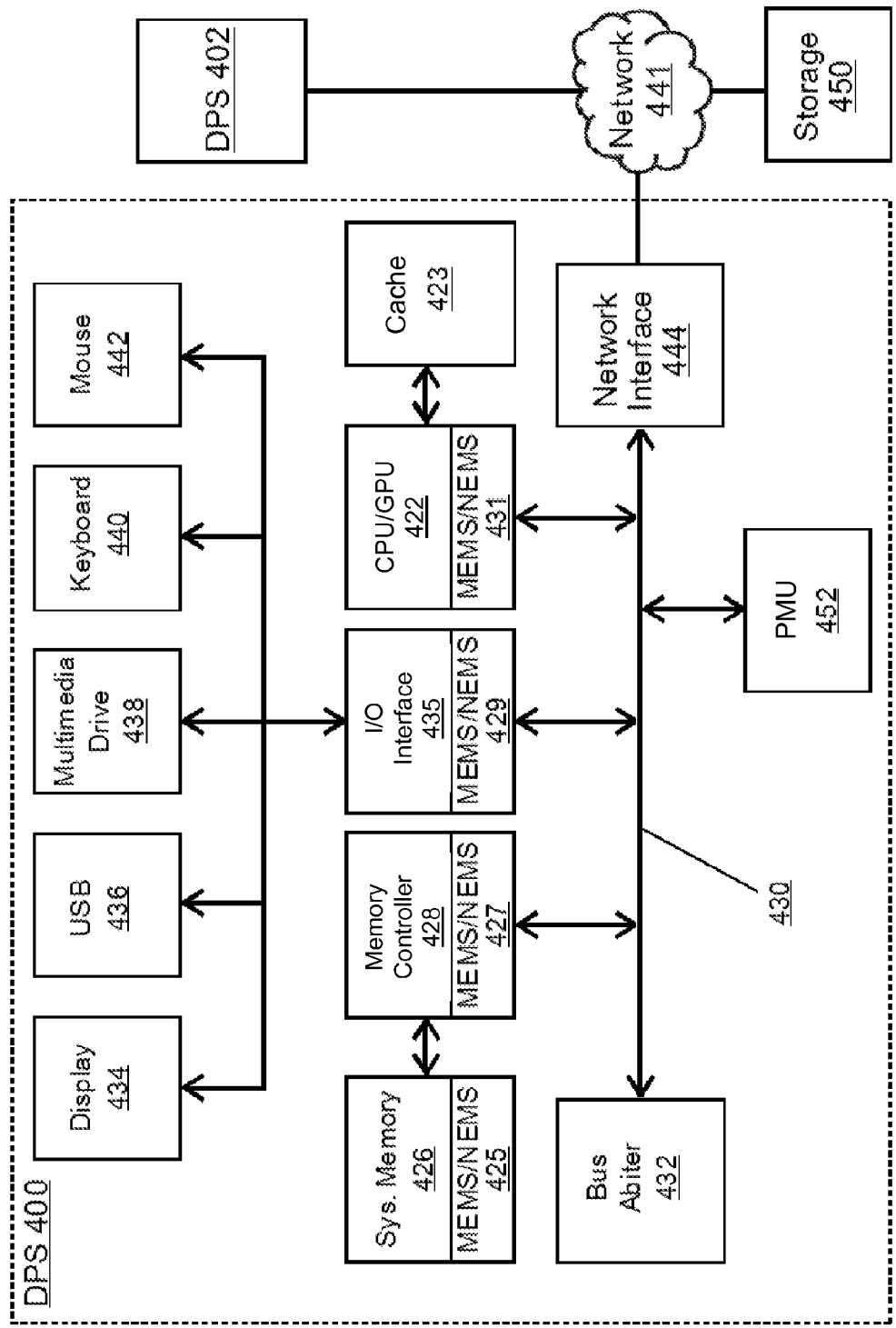
FIG. 4 provides a block diagram representation of an example data processing system within which one or more of the described embodiments are practiced.

Expanding the discussion as related to FIG. 3, FIG. 4 illustrates a block diagram representation of an example data processing system (DPS) 400, as utilized within one embodiment. The DPS 400 is useful for implementing MEMS/NEMS-based power gating, where power to one or more DPS circuit blocks is controlled by a MEMS/NEMS device and a power management unit, as described below. As used herein, the term "data processing system," is intended to include any type of computing device or machine that is capable of receiving, storing and running a software product including not only computer systems, but also devices such as communication devices (e.g., routers, switches, pagers, telephones, electronic books, electronic magazines and newspapers, etc.) and personal and home consumer devices (e.g., handheld computers, Web-enabled televisions, home automation systems, multimedia viewing systems, etc.).

As shown in FIG. 4, a DPS 400 may comprise a CPU/GPU 422 including an electromechanical switch 431, a system memory 426 including an electromechanical switch 425, where the system memory 426 is coupled to a memory controller 428 which includes an electromechanical switch 427, and a system interconnect 430 that couples the memory controller 428 to the CPU/GPU 422 and other components of the DPS 400. The system interconnect 430 in an embodiment can be an address and data bus. Commands on the system interconnect 430 are communicated to various system components under the control of a bus arbiter 432.

The DPS 400 can further include cache memory 423 for high speed storage of frequently used data. The cache memory 423 can be connected to or communicatively coupled to the CPU/GPU 422. While the cache memory 423 is shown operatively connected to the CPU/GPU 422, the cache memory 423 can also operatively be a part of the system memory 426.

The DPS 400 further includes computer readable storage media, such as one or more multimedia drives 438, including for example hard disk drives. Multimedia drives 438 provide non-volatile storage for the DPS 400. The DPS 400 also includes one or more user interface devices, which allow a user to provide input and receive output from the DPS 400. For example, user interface devices can include displays 434, keyboards 440, universal serial bus (USB) ports 436, and pointing devices such as a mouse 442. The multimedia drives 438 and the various user interface devices can be communicatively coupled to the system interconnect 430 by an I/O interface 435 which includes an electromechanical switch 429. Although the description of computer readable storage media above refers primarily to a hard disk, it should be appreciated by those skilled in the art that other types of media which are readable by a computer, such as removable magnetic disks, CD-ROM disks, magnetic cassettes, flash memory cards, digital video disks, Bernoulli cartridges, and other later-developed hardware, may also be used in the exemplary computer operating environment.

Actuation of electromechanical switches 425, 427, 429, 431 is controlled by a power management unit (PMU) 452, which is communicatively coupled to each of the electromechanical switches 425, 427, 429, 431 by way of the system interconnect 430. In some embodiments, the power management unit 452 includes a power switch circuit. The power switch circuit may include any of a plurality of IC devices, such as CMOS, BiCMOS, NMOS, and/or PMOS devices, among others. Moreover, each of the electromechanical switches 425, 427, 429, 431 can be used to control power grid connectivity of the circuit blocks to which each of the electromechanical switches are coupled, for example, to reduce power consumption during periods of inactivity and/or non-operation. For example, electromechanical switch 425 can be used to control power to the system memory 426, electromechanical switch 427 can be used to control power to the memory controller 428, electromechanical switch 429 can be used to control power to the I/O interface 435, and electromechanical switch 431 can be used to control power to the CPU/GPU 422 as well as to the cache memory 423, as discussed with reference to FIG. 3. In some embodiments, the entire CPU/GPU 422 may be shut off by way of the electromechanical switch 431. In other embodiments, at least one CPU/GPU internal component, such as an ALU, a CU, and/or a register, is shut off by way of the electromechanical switch 431. Illustratively, in response to a signal from the power management unit 452, one or more of the electromechanical switches 425, 427, 429, 431 can be actuated in such a way so as to turn off power to one or more of the system memory 426, the memory controller 428, the I/O interface 435, and the CPU/GPU 422. While the description of FIG. 4 has described using a MEMS/NEMS-based power gating technique for a specific subset of circuit blocks of the DPS 400, namely the system memory 426, the memory controller 428, the I/O interface 435, and the CPU/GPU 422, it will be appreciated that power supplied to other functional blocks within the DPS 400, such as for example the bus arbiter 432, the network interface 444, and each of the I/O devices including the display 434, the USB port 436, the multimedia drive 438, the keyboard 440, and the mouse 442, can also be controlled by using a MEMS/NEMS-based power gating technique.

The DPS 400 may also operate in a networked environment using logical connections to one or more remote computers or hosts, such as a DPS 402. The DPS 402 may be a computer, a server, a router or a peer device and typically includes many or all of the elements described relative to the DPS 400. In a networked environment, program modules employed by the DPS 400, or portions thereof, may be stored in a remote memory storage device 450. The logical connections depicted in FIG. 4 can include connections over a network 441. In one embodiment, the network 441 may be a local area network (LAN). In alternative embodiments, the network 441 may include a wide area network (WAN). The DPS 400 is connected to the network 441 through an input/output interface, such as a network interface 444. It will be appreciated that the network connections shown are exemplary and other means of establishing a communications link between the computers may be used.

Figure 5:
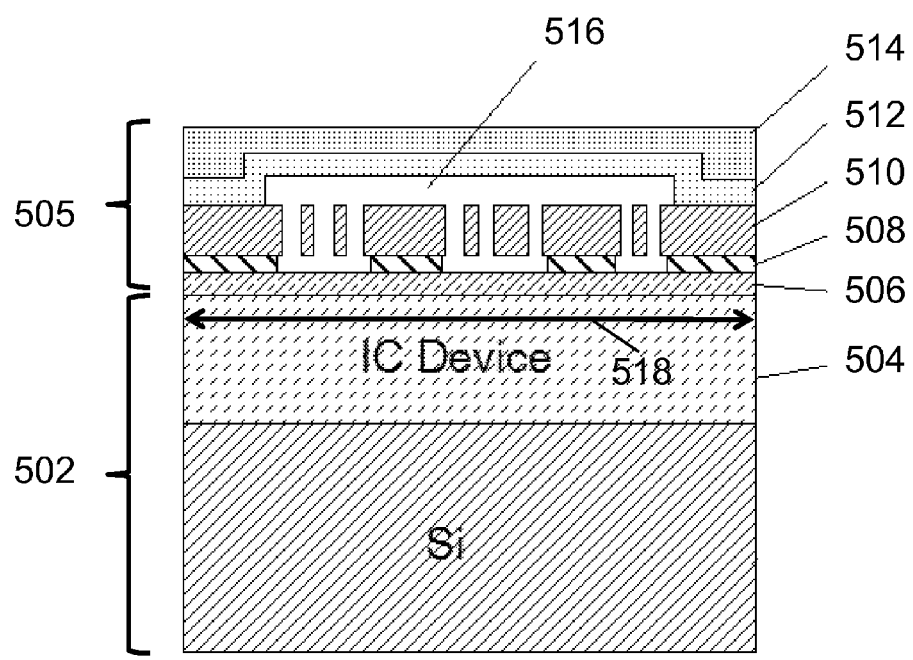
FIG. 5 shows at least one IC device monolithically integrated with an electromechanical power switch in accordance with some embodiments.

The electromechanical switches used to implement the various MEMS/NEMS-based power gating embodiments as shown in FIGS. 2-4 can be monolithically integrated with any of a plurality of circuit blocks in accordance with a variety of methods, as discussed below, using standard semiconductor processing techniques, such as for example, photolithography, etching processes (e.g., wet, dry, and/or plasma etching), deposition processes, and/or other standard processes. Moreover, the electromechanical switches discussed herein may include a plurality of configurations, structural features, and materials such as metal, polycrystalline silicon (poly-Si), dielectrics, and/or other materials well known in the art. For example, in some embodiments, the electromechanical switches may include a vertical structure, where a MEMS/NEMS structural layer (e.g., a cantilever) is actuated in a vertical direction. In other embodiments, the electromechanical switches may include a lateral structure, where the MEMS/NEMS structural layer is actuated in a horizontal direction. The discussion of specific processes, configurations, structural features, and/or materials used in the formation of the electromechanical switches discussed herein is not meant to be limiting, and the choice of specific processes, device configurations, structural features, and/or materials may vary depending, for example, on the type of MEMS and/or NEMS device that is desired. By way of example, FIG. 5 shows at least one IC device monolithically integrated with an electromechanical power switch 505, in accordance with some embodiments. A semiconductor substrate 502 is provided, upon which any of a plurality of IC devices are formed within an IC device layer 504 of the semiconductor substrate 502, according to standard semiconductor processing techniques. In some embodiments, such as in the example of FIG. 5, the semiconductor substrate 502 includes a silicon (Si) substrate. In other embodiments, the semiconductor substrate 502 may include, for example, a germanium (Ge) substrate, a silicon-germanium (SiGe) substrate, a silicon-on-insulator (SOI) substrate, a silicon carbide (SiC) substrate, a gallium arsenide (GaAs) substrate, an indium arsenide (InAs) substrate, an indium gallium arsenide (InGaAs) substrate, an indium phosphide (InP), or another substrate as well known in the art. The IC devices formed within the IC device layer 504 may include any combination of a CMOS device, a BiCMOS device, an NMOS device, and/or a PMOS device, among others. Moreover, in some embodiments, at least some of the IC devices formed within the IC device layer 504 may form a power switch circuit useful for controlling power to any of a plurality of circuit blocks, where at least some of the IC devices within the IC device layer 504 may form circuit blocks such as a logic circuit, a CPU, a GPU, an MCU, an RF circuit, an analog circuit, a memory, a memory controller, and/or an I/O interface, among others. In some embodiments, the IC devices may be stacked within the IC device layer 504.

In some embodiments, the formation of an embedded electromechanical power switch 505, such as a MEMS/NEMS-based power switch, includes the formation of a dielectric layer 506 over the IC device layer 504 of the semiconductor substrate 502. In various embodiments, the dielectric layer 506 includes a silicon nitride layer, such as a plasma-enhanced chemical vapor deposition (PECVD) silicon nitride layer, or the like. In other embodiments, and depending on the material used for the dielectric layer 506, the dielectric layer may be deposited by CVD, physical vapor deposition (PVD), atomic layer deposition (ALD), or other well-known techniques. A sacrificial oxide layer 508, such as a PECVD oxide layer, is formed over the dielectric layer 506, and a subsequent photolithography step can be used to define a pattern for etching of the oxide layer 508. A MEMS/NEMS structural layer 510 is formed over the oxide layer 508, and may include any of a plurality of materials such as in-situ doped (e.g., phosphorous (P), boron (B) doped) single-crystal silicon (Si), polycrystalline silicon (poly-Si), amorphous silicon (a-Si), metals such as titanium nitride (TiN), tantalum nitride (TaN), tantalum silicon nitride (TaSiN), aluminum nitride (AlN), boron nitride (BN), and/or a binary/ternary metal, among others. In some embodiments, the MEMS/NEMS structural layer 510 includes at least one mechanical structure, such as a cantilever, used to alternately open/close an air gap between at least two electrodes and alternately provide a very low-resistance contact or a near-infinite resistance contact. In various embodiments, the MEMS/NEMS structural layer 510 may contain a combination of conductive and dielectric layers (e.g., Si, metal, SiN, BN, AN) to improve the conduction and/or reliability of the at least one mechanical structure (e.g., the cantilever). Formation of the MEMS/NEMS structural layer 510 may include any of a plurality of processing steps, such as material deposition, photolithography to define patterns in the deposited layers, and etching processes to further define the patterned layers and release the at least one mechanical structure of the MEMS/NEMS structural layer. The MEMS/NEMS structural layer 510 is capped by an encapsulation layer 512, which may include a PECVD thin film layer, such as a silicon nitride layer, an oxide layer, and/or a combination of the two, among others. Formation of the encapsulation layer 512 also defines a cavity region 516, as shown in FIG. 5. Rather than using a wafer-bonding encapsulation layer, which provides a stable, hermetic seal but does not allow for further device processing, a thin-film encapsulation layer, such as the encapsulation layer 512, while providing a stable, hermetic seal also provides for continued semiconductor processing such as the formation of additional electromechanical power switches stacked above the electromechanical power switch 505, as shown below, for example in FIG. 6, and/or various other semiconductor processing. In some embodiments, a protective layer 514 is formed over the encapsulation layer 512, and is useful for protecting the electromechanical power switch 505. In some embodiments, the protective layer 514 includes an oxide layer, and/or a silicon nitride layer, among others. The protective layer 514 may be deposited, for example, by a low-temperature physical vapor deposition (PVD) process, a CVD process, a PECVD process, or an ALD process.

Actuation of the electromechanical power switch 505, for example, by a power switch circuit within the IC device layer 504, can be used to switch OFF/ON power to any of a plurality of circuit blocks within the IC device layer 504. Moreover, by using a MEMS/NEMS-based power gate, the OFF-state leakage current of the electromechanical power switch 505 is nearly zero, and thus the standby/OFF-state consumed power resulting from turning off any of the plurality of circuit blocks within the IC device layer 504 by actuation of the electromechanical power switch 505, is nearly zero. In some embodiments, the electromechanical power switch 505, and at least one circuit block within the IC device layer 504 to which the electromechanical power switch 505 is coupled, are formed within a specified area 518 on the front surface of the semiconductor substrate 502.

Figure 6:
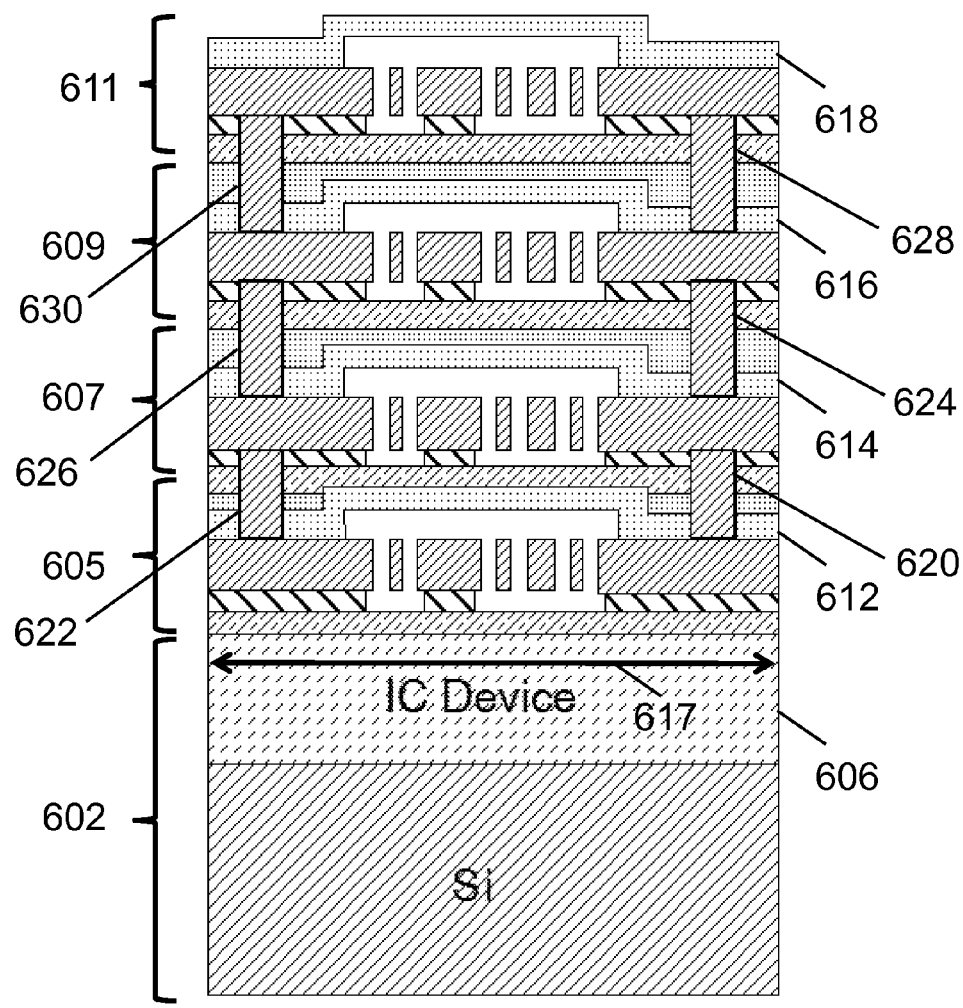
FIG. 6 shows at least one IC device monolithically integrated with a plurality of stacked electromechanical power switches according to some embodiments.

FIG. 6 illustrates at least one IC device monolithically integrated with a plurality of stacked electromechanical power switches 605, 607, 609, 611, in accordance with some embodiments. While four stacked electromechanical power switches are shown by way of example in FIG. 6, it should be understood that any number of electromechanical power switches may be stacked. In some embodiments, each of the electromechanical power switches 605, 607, 609, 611 are formed in a similar manner as the electromechanical power switch 505, as described with reference to FIG. 5. As shown in FIG. 6, a thin-film encapsulation layer, such as encapsulation layers 612, 614, 616, 618 provide a stable, hermetic seal for each of the electromechanical power switches 605, 607, 609, 611, and also provide for continued semiconductor processing, as opposed to a wafer-bonding encapsulation, and thus facilitate the formation of the stacked electromechanical power switches 605, 607, 609, 611. Stacking of the embedded, electromechanical power switches 605, 607, 609, 611 can be used to preserve valuable semiconductor real estate area. Moreover, one or more of the stacked, embedded electromechanical power switches 605, 607, 609, 611 may be electrically coupled to each other in order to provide a higher ON-state current, for example by way of vertical electrical connections (VIAs) 620, 622, 624, 626, 628, 630, as compared to the ON-state current provided by a single electromechanical switch, while still able to maintain an OFF-state leakage current near zero. In some embodiments, the electromechanical power switches 605, 607, 609, 611 and at least one circuit block within an IC device layer 606 to which at least one of the electromechanical power switches 605, 607, 609, 611 is coupled, are formed within a specified area 617 on the front surface of a semiconductor substrate 602.

Figure 7:
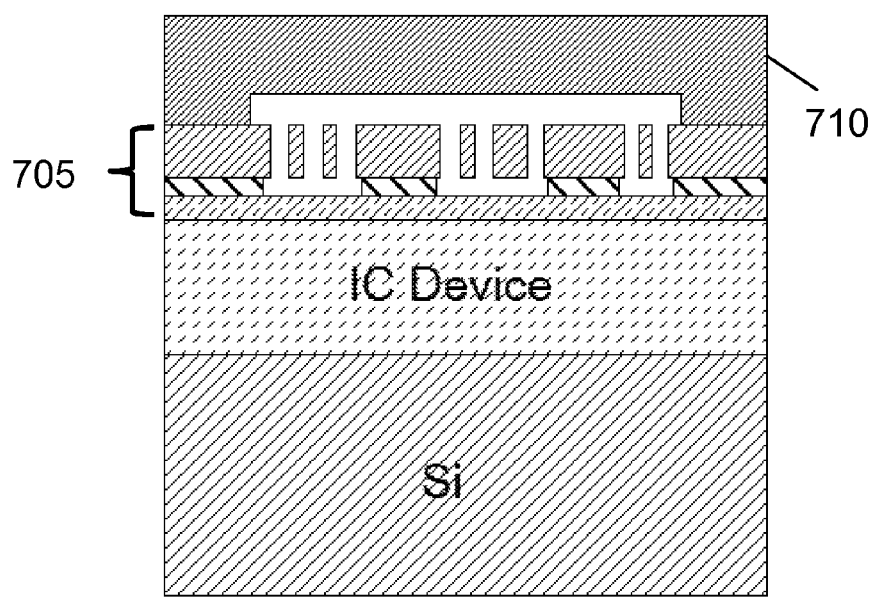
FIG. 7 illustrates at least one IC device monolithically integrated with an electromechanical power switch having a wafer bonding encapsulation in accordance with at least one embodiment.

Referring now to FIG. 7, at least one IC device is shown monolithically integrated with an electromechanical power switch 705 having a wafer bonding encapsulation in accordance with at least one embodiment. The electromechanical power switch 705 is formed in a similar manner as the electromechanical power switch 505, as described with reference to FIG. 5; however, instead of using a thin-film encapsulation layer, the electromechanical power switch 705 is sealed and protected by a wafer bonding encapsulation 710.

Figure 8:
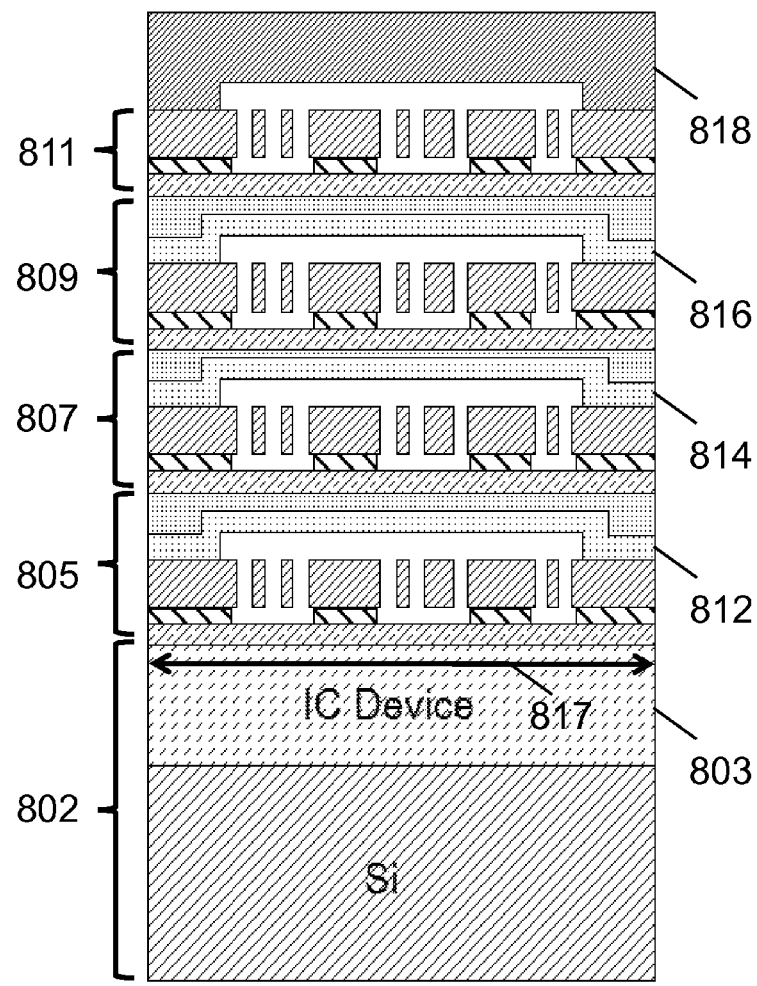
FIG. 8 shows at least one IC device monolithically integrated with a plurality of stacked electromechanical power switches and having a wafer bonding encapsulation according to some embodiments.

FIG. 8 illustrates at least one IC device monolithically integrated with a plurality of stacked electromechanical power switches 805, 807, 809, 811, having a wafer bonding encapsulation in accordance with some embodiments. FIG. 8 shows four stacked electromechanical power switches; however, it should be understood that any number of electromechanical power switches may be stacked. In some embodiments, each of the electromechanical power switches 805, 807, 809, 811 are formed in a similar manner as the electromechanical power switch 505, as described with reference to FIG. 5. However, instead of using a thin-film encapsulation layer for the electromechanical power switch 811, the electromechanical power switch 811 is sealed and protected by a wafer bonding encapsulation 818. As shown in FIG. 8, a thin-film encapsulation layer, such as encapsulation layers 812, 814, 816 provide a stable, hermetic seal for each of the electromechanical power switches 805, 807, 809, and facilitate the stacking of the electromechanical power switches 805, 807, 809, 811. As discussed above, stacking of the embedded, electromechanical power switches 805, 807, 809, 811 can be used to preserve valuable semiconductor real estate area. Moreover, one or more of the stacked, embedded electromechanical power switches 805, 807, 809, 811 may be electrically coupled to each other in order to provide a higher ON-state current, as compared to the ON-state current provided by a single electromechanical switch, while still able to maintain the OFF-state leakage current near zero. In some embodiments, the electromechanical power switches 805, 807, 809, 811 and at least one circuit block within an IC device layer 803 to which at least one of the electromechanical power switches 805, 807, 809, 811 is coupled, are formed within a specified area 817 on the front surface of a semiconductor substrate 802.

Figure 9:
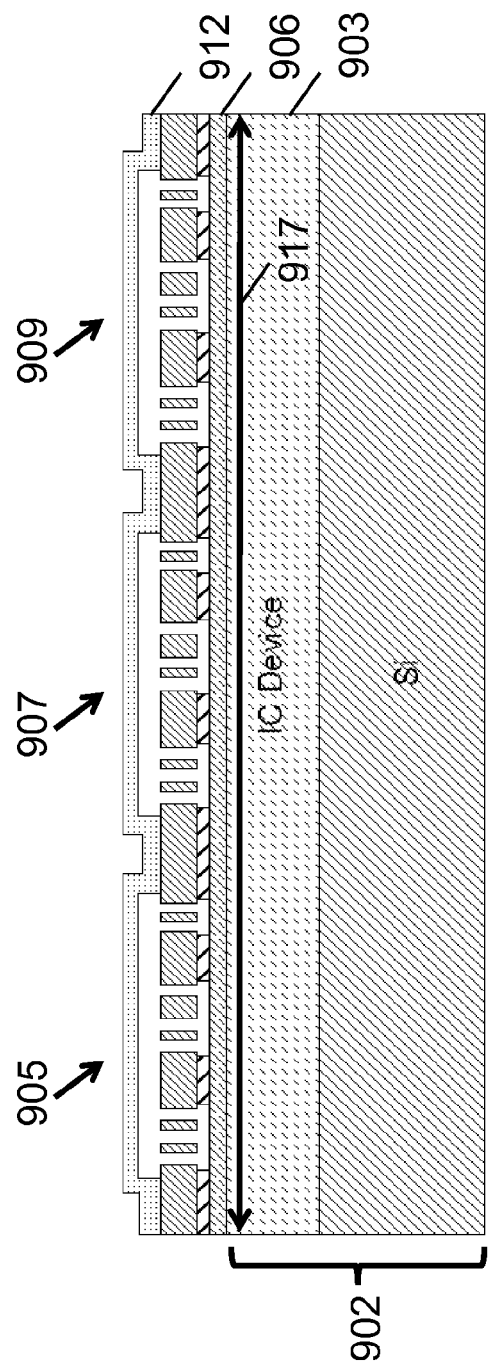
FIG. 9 illustrates at least one IC device monolithically integrated with a plurality of electromechanical power switches according to various embodiments.

FIG. 9 illustrates at least one IC device monolithically integrated with a plurality of electromechanical power switches 905, 907, 909, according to various embodiments. In some embodiments, each of the electromechanical power switches 905, 907, 909, are formed in a similar manner as the electromechanical power switch 505, as described with reference to FIG. 5. However, instead of stacking the electromechanical switches 905, 907, 909, as shown for example in FIG. 6 and/or FIG. 8, the plurality of electromechanical switches 905, 907, 909 are formed horizontally adjacent to one another and directly over a dielectric layer 906. A thin-film encapsulation layer, such as encapsulation layer 912, provides a stable, hermetic seal for each of the electromechanical power switches 905, 907, 909, and also provides for continued semiconductor processing over the electromechanical power switches 905, 907, 909. In some embodiments, one or more of the plurality of electromechanical power switches 905, 907, 909, may be electrically coupled to each other in order to provide a higher ON-state current, as compared to the ON-state current provided by a single electromechanical switch, while still able to maintain the OFF-state leakage current near zero. In some embodiments, at least one of the electromechanical power switches 905, 907, 909, and at least one circuit block within an IC device layer 903 to which the at least one of the electromechanical power switches 905, 907, 909 is coupled, are formed within a specified area 917 on the front surface of a semiconductor substrate 902.

Figure 10:
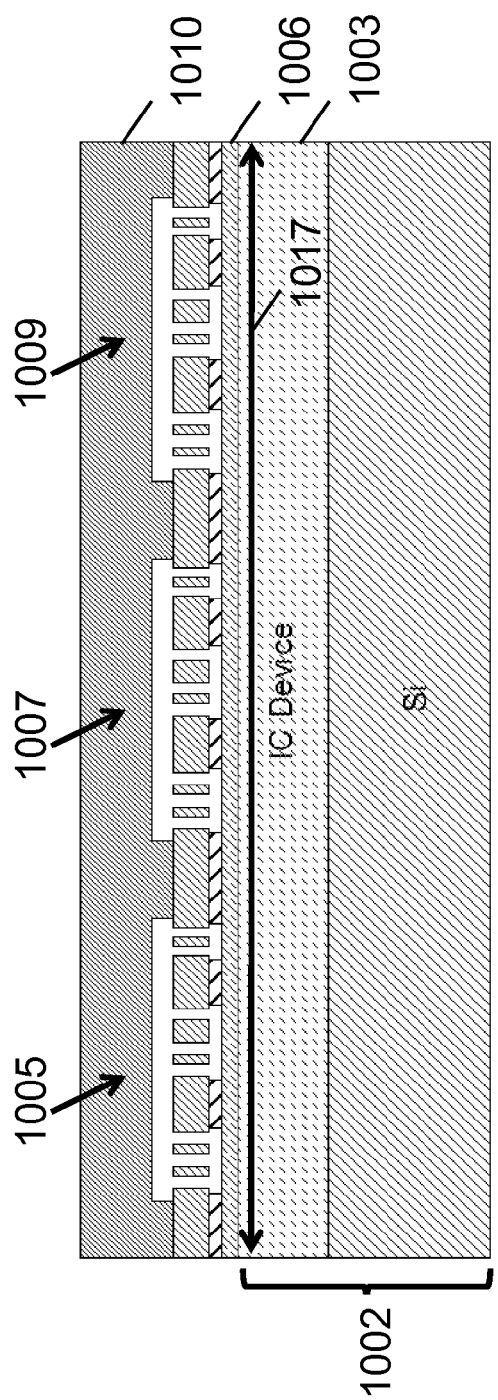
FIG. 10 illustrates at least one IC device monolithically integrated with a plurality of electromechanical power switches and having a wafer bonding encapsulation in accordance with some embodiments.

In reference to FIG. 10, at least one IC device is shown monolithically integrated with a plurality of electromechanical power switch 1005, 1007, 1009, having a wafer bonding encapsulation in accordance with at least one embodiment. In some embodiments, each of the electromechanical power switches 1005, 1007, 1009, are formed in a similar manner as the electromechanical power switch 505, as described with reference to FIG. 5. However, instead of stacking the electromechanical switches 1005, 1007, 1009, as shown in FIG. 6 and FIG. 8, the plurality of electromechanical switches 1005, 1007, 1009 are formed horizontally adjacent to one another and directly over a dielectric layer 1006. Also, in some embodiments, instead of using a thin-film encapsulation layer, the electromechanical power switches 1005, 1007, 1009 are sealed and protected by a wafer bonding encapsulation 1010. In some embodiments, one or more of the plurality of electromechanical power switches 1005, 1007, 1009, may be electrically coupled to each other in order to provide a higher ON-state current, as compared to the ON-state current provided by a single electromechanical switch, while still able to maintain the OFF-state leakage current near zero. In some embodiments, at least one of the electromechanical power switches 1005, 1007, 1009, and at least one circuit block within an IC device layer 1003 to which the at least one of the electromechanical power switches 1005, 1007, 1009 is coupled, are formed within a specified area 1017 on the front surface of a semiconductor substrate 1002.

Figure 11:
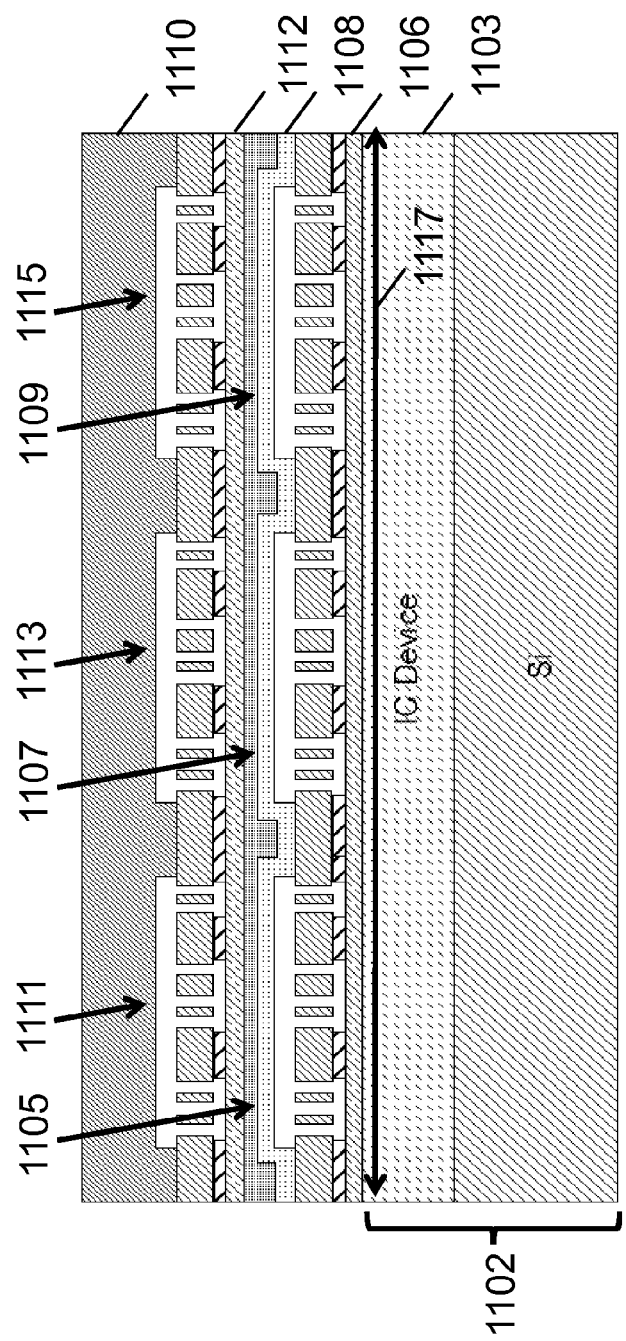
FIG. 11 shows at least one IC device monolithically integrated with a plurality of electromechanical power switches with a thin-film encapsulation and a plurality of electromechanical power switches with a wafer bonding encapsulation according to some embodiments.

FIG. 11 illustrates at least one IC device monolithically integrated with a plurality of electromechanical power switches 1105, 1107, 1109, 1111, 1113, 1115 having a wafer bonding encapsulation in accordance with at least one embodiment. In some embodiments, each of the electromechanical power switches 1105, 1107, 1109, 1111, 1113, 1115, are formed in a similar manner as the electromechanical power switch 505, as described with reference to FIG. 5. As shown in FIG. 11, the plurality of electromechanical switches 1105, 1107, 1109 are formed horizontally adjacent to one another and directly over a dielectric layer 1106. A dielectric layer 1112 is formed over the plurality of electromechanical switches 1105, 1107, 1109, and the plurality of electromechanical switches 1111, 1113, 1115 are formed horizontally adjacent to one another and directly over the dielectric layer 1112. In some embodiments, a thin-film encapsulation layer 1108 is used to protect and seal the electromechanical power switches 1105, 1107, 1109, and a wafer bonding encapsulation 1110 is used to protect and seal the electromechanical power switches 1111, 1113, 1115. In some embodiments, one or more of the plurality of electromechanical power switches 1105, 1107, 1109, 1111, 1113, 1115, may be electrically coupled to each other in order to provide a higher ON-state current, as compared to the ON-state current provided by a single electromechanical switch, while still able to maintain the OFF-state leakage current near zero. In some embodiments, at least one of the electromechanical power switches 1105, 1107, 1109, 1111, 1113, 1115, and at least one circuit block within an IC device layer 1103 to which the at least one of the electromechanical power switches 1105, 1107, 1109, 1111, 1113, 1115 is coupled, are formed within a specified area 1117 on the front surface of a semiconductor substrate 1102.

Figure 12:
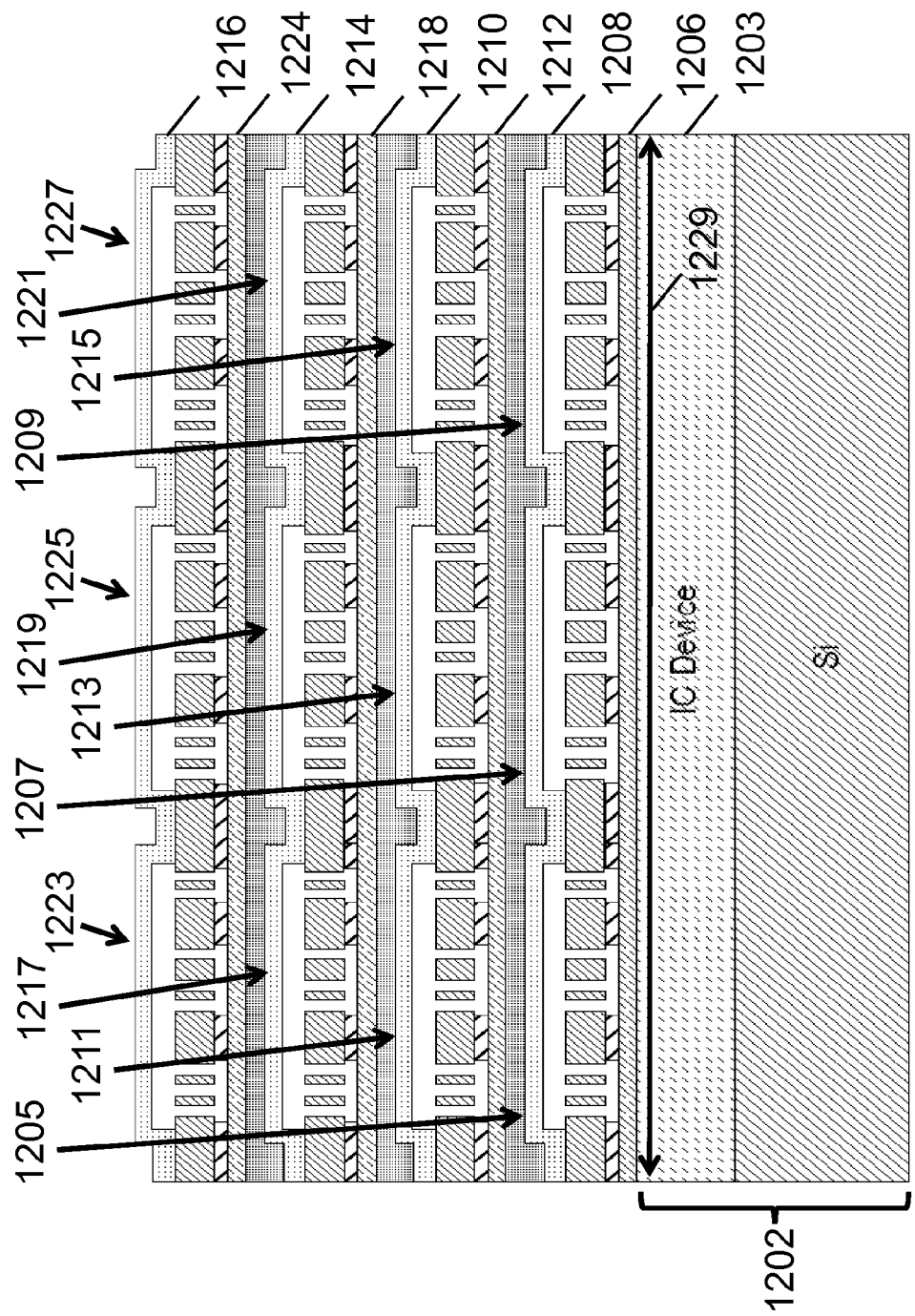
FIG. 12 shows at least one IC device monolithically integrated with a plurality of stacked electromechanical power switches having a thin-film encapsulation according to various embodiments.

FIG. 12 shows at least one IC device monolithically integrated with a plurality of electromechanical power switches 1205, 1207, 1209, 1211, 1213, 1215, 1217, 1219, 1221, 1223, 1225, 1227, having a thin film encapsulation in accordance with at least one embodiment. In some embodiments, each of the electromechanical power switches 1205, 1207, 1209, 1211, 1213, 1215, 1217, 1219, 1221, 1223, 1225, 1227, are formed in a similar manner as the electromechanical power switch 505, as described with reference to FIG. 5. As shown in FIG. 12, the plurality of electromechanical switches 1205, 1207, 1209 are formed horizontally adjacent to one another and directly over a dielectric layer 1206. A dielectric layer 1212 is formed over the plurality of electromechanical switches 1205, 1207, 1209, and the plurality of electromechanical switches 1211, 1213, 1215 are formed horizontally adjacent to one another and directly over the dielectric layer 1212. In various embodiments, a dielectric layer 1218 is formed over the plurality of electromechanical switches 1211, 1213, 1215, and the plurality of electromechanical switches 1217, 1219, 1221 are formed horizontally adjacent to one another and directly over the dielectric layer 1218. As shown, a dielectric layer 1224 is formed over the plurality of electromechanical switches 1217, 1219, 1221, and the plurality of electromechanical switches 1223, 1225, 1227 are formed horizontally adjacent to one another and directly over the dielectric layer 1224. In some embodiments, a thin-film encapsulation layer 1208 is used to protect and seal the electromechanical power switches 1205, 1207, 1209, a thin-film encapsulation layer 1210 is used to protect and seal the electromechanical power switches 1211, 1213, 1215, a thin-film encapsulation layer 1214 is used to protect and seal the electromechanical power switches 1217, 1219, 1221, and a thin-film encapsulation layer 1216 is used to protect and seal the electromechanical power switches 1223, 1225, 1227. In some embodiments, one or more of the plurality of electromechanical power switches 1205, 1207, 1209, 1211, 1213, 1215, 1217, 1219, 1221, 1223, 1225, 1227, may be electrically coupled to each other in order to provide a higher ON-state current, as compared to the ON-state current provided by a single electromechanical switch, while still able to maintain the OFF-state leakage current near zero. In some embodiments, at least one of the electromechanical power switches 1205, 1207, 1209, 1211, 1213, 1215, 1217, 1219, 1221, 1223, 1225, 1227, and at least one circuit block within an IC device layer 1203 to which the at least one of the electromechanical power switches 1205, 1207, 1209, 1211, 1213, 1215, 1217, 1219, 1221, 1223, 1225, 1227 is coupled, are formed within a specified area 1229 on the front surface of a semiconductor substrate 1202.

Figure 13:
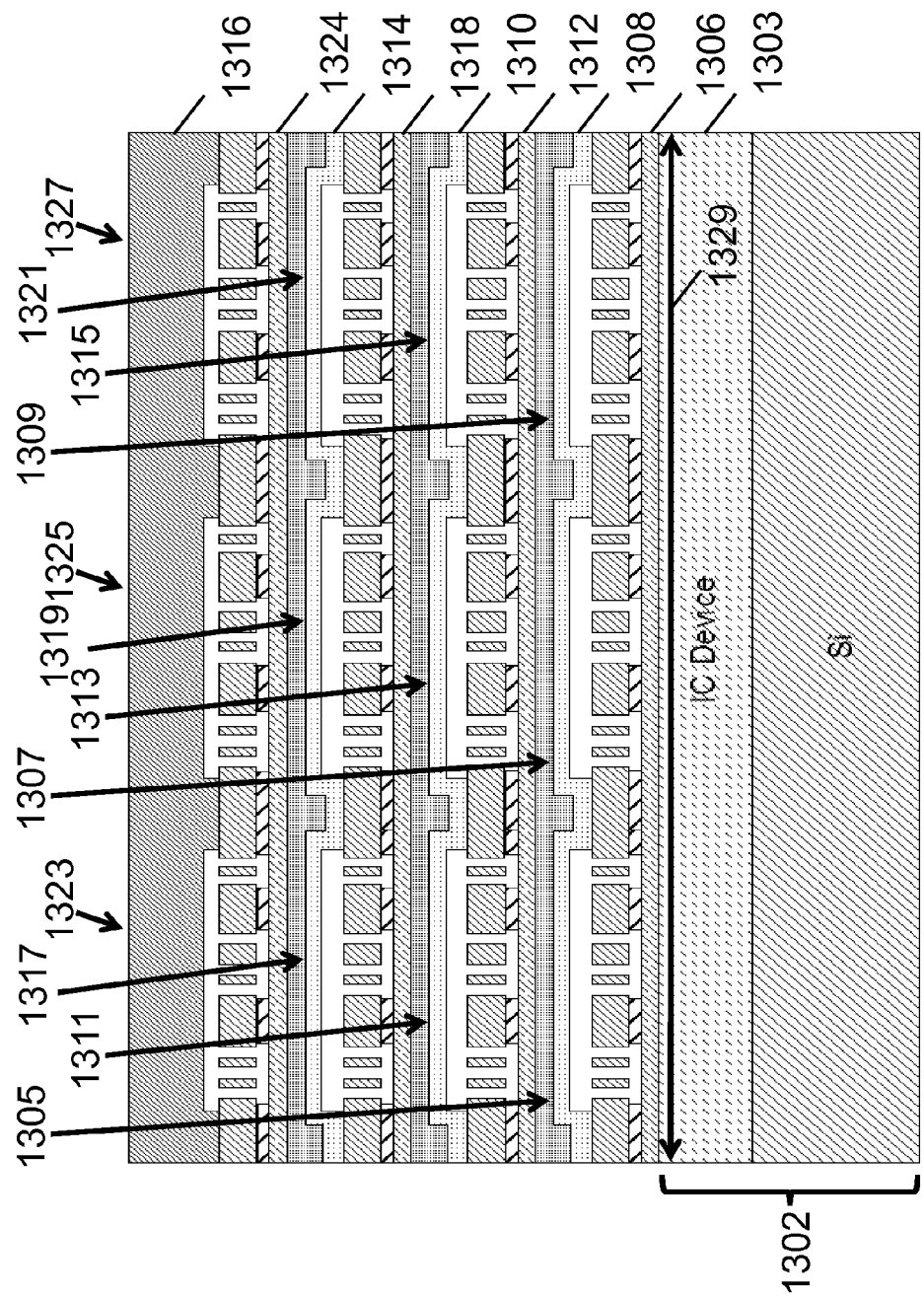
FIG. 13 shows at least one IC device monolithically integrated with a plurality of stacked electromechanical power switches having a thin-film encapsulation and a plurality of electromechanical power switches with a wafer bonding encapsulation according to various embodiments.

FIG. 13 illustrates at least one IC device monolithically integrated with a plurality of electromechanical power switches 1305, 1307, 1309, 1311, 1313, 1315, 1317, 1319, 1321, 1323, 1325, 1327, having a wafer bonding encapsulation in accordance with at least one embodiment. In some embodiments, each of the electromechanical power switches 1305, 1307, 1309, 1311, 1313, 1315, 1317, 1319, 1321, 1323, 1325, 1327, are formed in a similar manner as the electromechanical power switch 505, as described with reference to FIG. 5. As shown in FIG. 13, the plurality of electromechanical switches 1305, 1307, 1309 are formed horizontally adjacent to one another and directly over a dielectric layer 1306. A dielectric layer 1312 is formed over the plurality of electromechanical switches 1305, 1307, 1309, and the plurality of electromechanical switches 1311, 1313, 1315 are formed horizontally adjacent to one another and directly over the dielectric layer 1312. In various embodiments, a dielectric layer 1318 is formed over the plurality of electromechanical switches 1311, 1313, 1315, and the plurality of electromechanical switches 1317, 1319, 1321 are formed horizontally adjacent to one another and directly over the dielectric layer 1318. As shown, a dielectric layer 1324 is formed over the plurality of electromechanical switches 1317, 1319, 1321, and the plurality of electromechanical switches 1323, 1325, 1327 are formed horizontally adjacent to one another and directly over the dielectric layer 1324. In some embodiments, a thin-film encapsulation layer 1308 is used to protect and seal the electromechanical power switches 1305, 1307, 1309, a thin-film encapsulation layer 1310 is used to protect and seal the electromechanical power switches 1311, 1313, 1315, a thin-film encapsulation layer 1314 is used to protect and seal the electromechanical power switches 1317, 1319, 1321, and a wafer bonding encapsulation layer 1316 is used to protect and seal the electromechanical power switches 1323, 1325, 1327. In some embodiments, one or more of the plurality of electromechanical power switches 1305, 1307, 1309, 1311, 1313, 1315, 1317, 1319, 1321, 1323, 1325, 1327, may be electrically coupled to each other in order to provide a higher ON-state current, as compared to the ON-state current provided by a single electromechanical switch, while still able to maintain the OFF-state leakage current near zero. In some embodiments, at least one of the electromechanical power switches 1305, 1307, 1309, 1311, 1313, 1315, 1317, 1319, 1321, 1323, 1325, 1327, and at least one circuit block within an IC device layer 1303 to which the at least one of the electromechanical power switches 1305, 1307, 1309, 1311, 1313, 1315, 1317, 1319, 1321, 1323, 1325, 1327 is coupled, are formed within a specified area 1329 on the front surface of a semiconductor substrate 1302.

Figure 14:
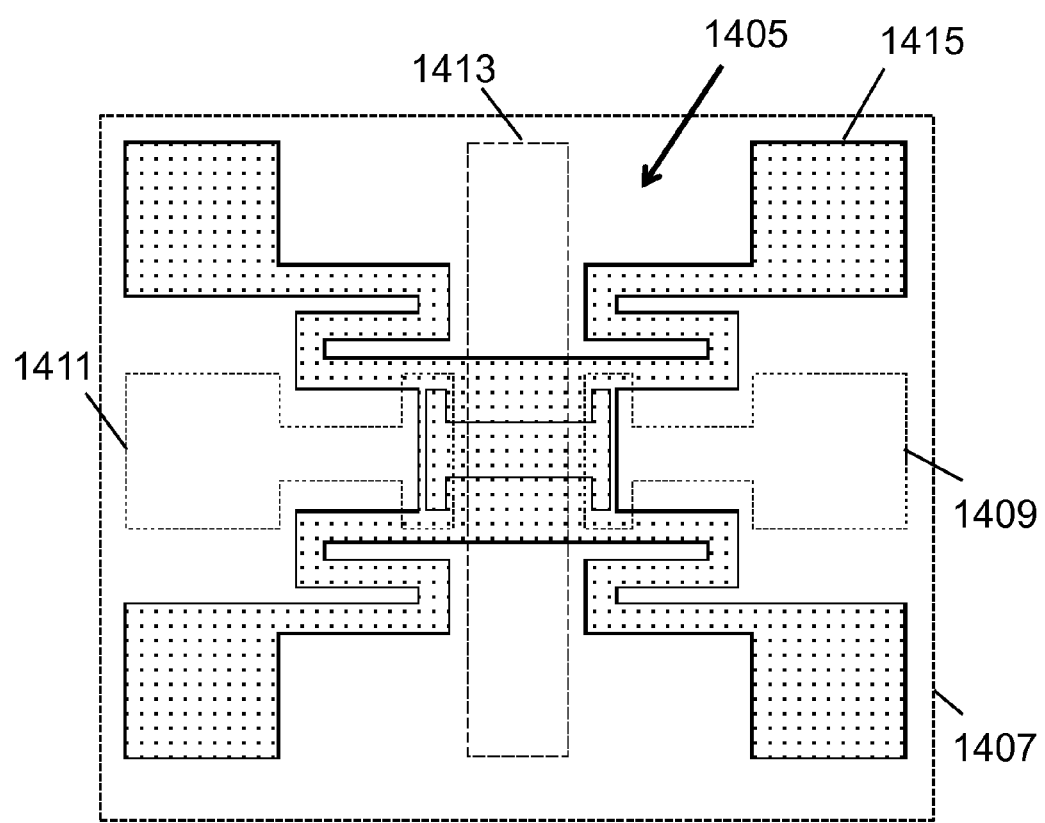
FIG. 14 illustrates a top-view of an embedded vertical electromechanical power switch formed within an area defined by a circuit block according to some embodiments.

Referring now to FIG. 14, FIG. 14 illustrates a top-view of an embedded vertical electromechanical power switch 1405 including a source 1409, a drain 1411, a body 1413, and a gate 1415. The electromechanical power switch 1405 is formed within an area defined by a DPS circuit block 1407 in accordance with some embodiments. For example, as discussed above with reference to FIGS. 5-13, in some embodiments at least one electromechanical power switch, such as the electromechanical power switch 1405, and at least one circuit block, such as the circuit block 1407, to which the electromechanical power switch 1405 is coupled, are formed within an area on a front surface of a semiconductor substrate. In various embodiments, the area on the front surface of the semiconductor substrate is defined by an area bounded by the circuit block 1407.

Figure 15:
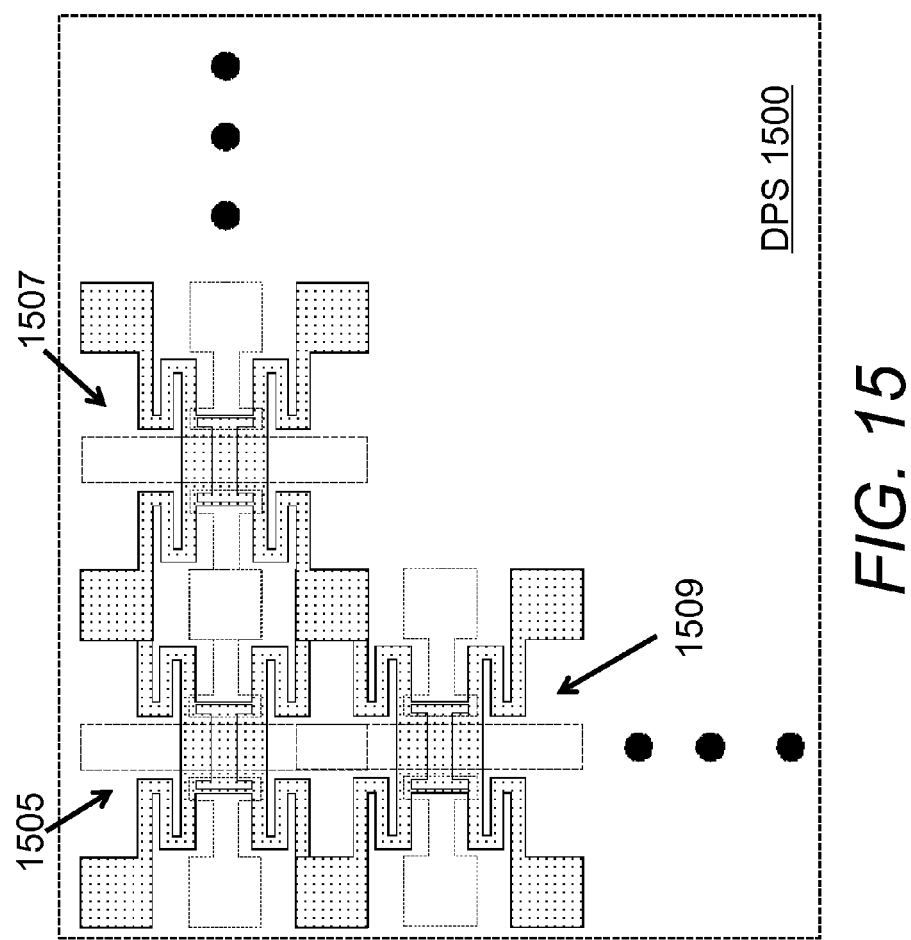
FIG. 15 illustrates a top-view of an array of embedded vertical electromechanical power switches formed within a data processing system according to some embodiments.

FIG. 15 illustrates a top-view of an array of embedded vertical electromechanical power switches 1505, 1507, 1509 formed within a DPS 1500. As shown, any number of a plurality of electromechanical switches may be formed throughout the DPS 1500, and formation of the plurality of the electromechanical switches is not constrained to an area defined by a DPS circuit block, as discussed with reference to FIG. 14.

Figure 16:
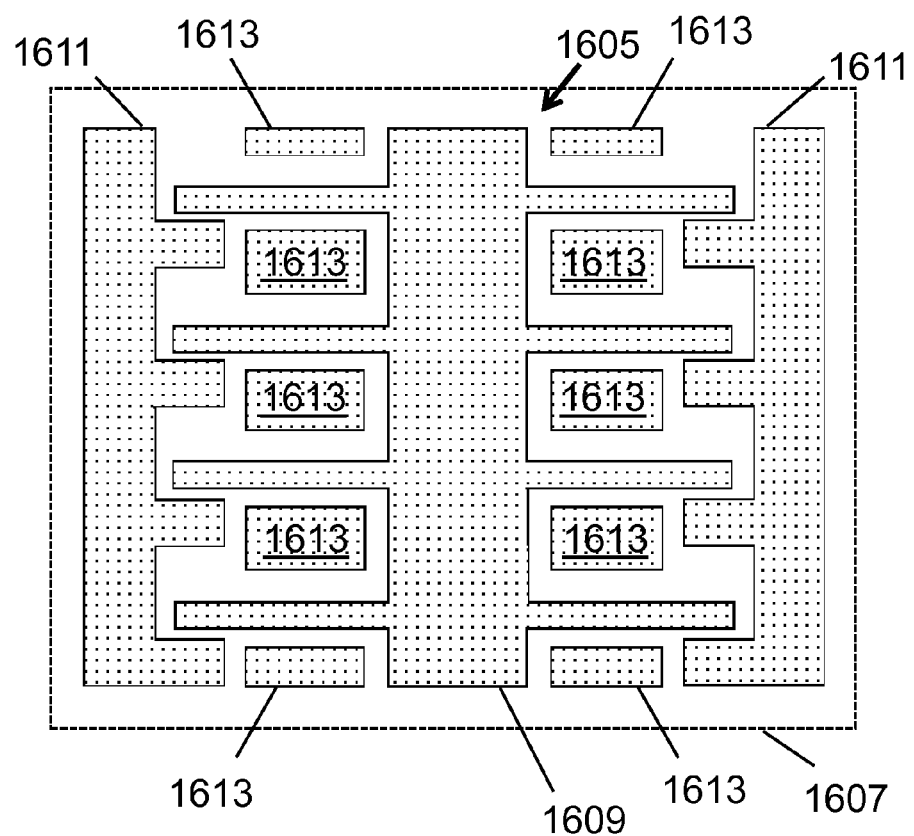
FIG. 16 shows a top-view of an embedded lateral electromechanical power switch formed within an area defined by a circuit block according to some embodiments.

Referring now to FIG. 16, FIG. 16 shows a top-view of an embedded lateral electromechanical power switch 1605 including a source 1609, a drain 1611, and a gate 1613. The electromechanical power switch 1605 is formed within an area defined by a circuit block 1607 in accordance with some embodiments. For example, as discussed above with reference to FIGS. 5-13, in some embodiments at least one electromechanical power switch, such as the electromechanical power switch 1605, and at least one circuit block, such as the circuit block 1607, to which the electromechanical power switch 1605 is coupled, are formed within an area on a front surface of a semiconductor substrate. In various embodiments, the area on the front surface of the semiconductor substrate is defined by an area bounded by the circuit block 1607.

Figure 17:
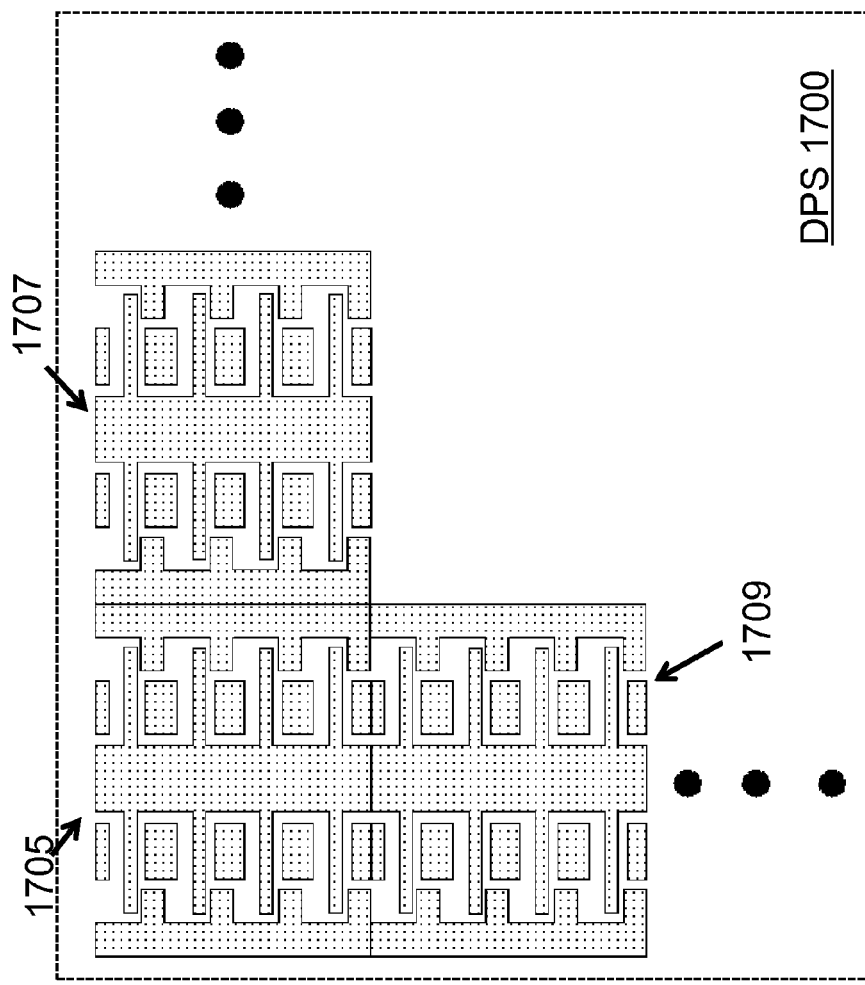
FIG. 17 shows a top-view of an array of embedded lateral electromechanical power switches formed within the data processing system according to some embodiments.

FIG. 17 illustrates a top-view of an array of embedded lateral electromechanical power switches 1705, 1707, 1709 formed within a DPS 1700. As shown, any number of a plurality of electromechanical switches may be formed throughout the DPS 1700, and formation of the plurality of the electromechanical switches is not constrained to an area defined by a circuit block, as discussed with reference to FIG. 16.

Figure 18:
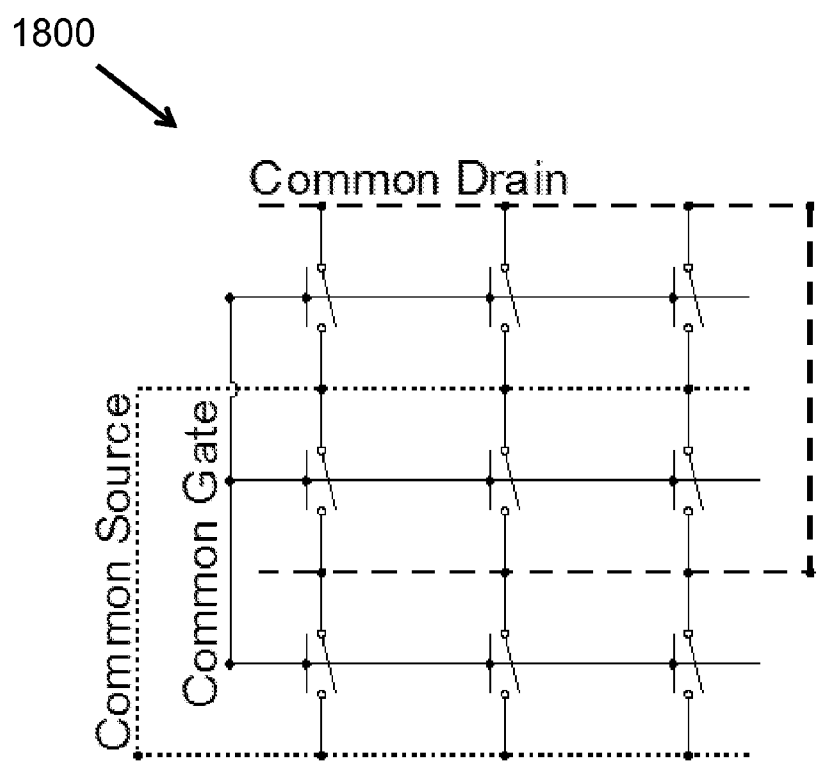
FIG. 18 shows a schematic circuit of an array of embedded electromechanical power switches according to some embodiments.

FIG. 18 illustrates a schematic circuit 1800 of an array of embedded electromechanical power switches, such as for example the array of embedded electromechanical power switches shown in FIG. 15 and FIG. 17. In some embodiments, the array of embedded electromechanical power switches shown in the schematic circuit 1800 is connected in a common-drain/common-source/common-gate configuration. In other embodiments, alternative configurations of the array of embedded electromechanical power switches may be used, for example depending on specific applications requirements.

Figure 19:
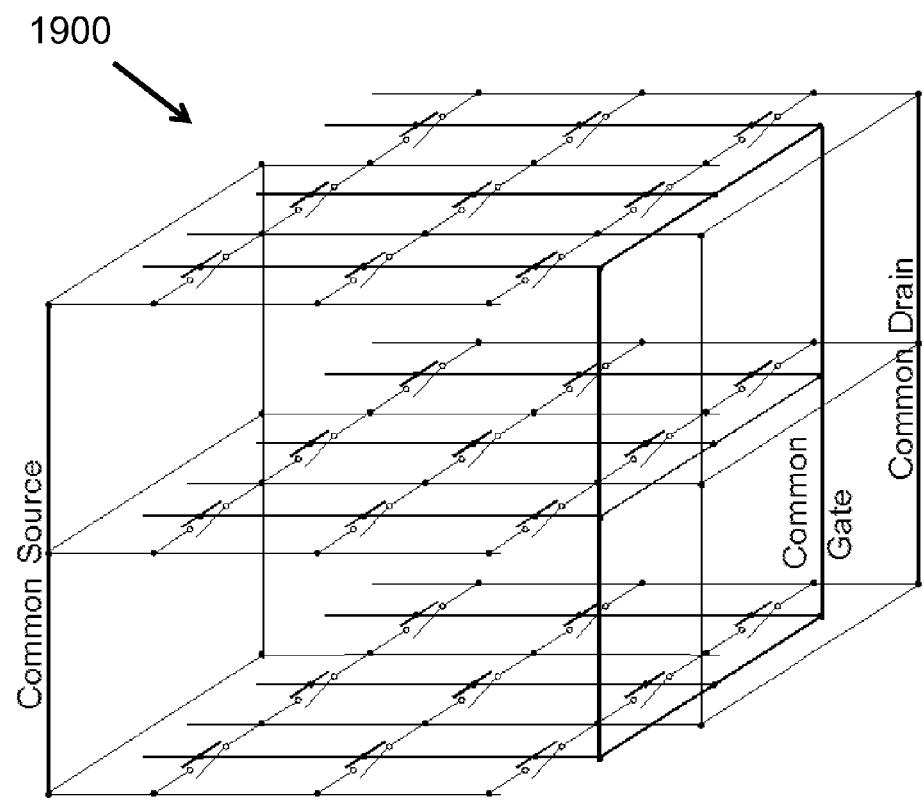
FIG. 19 shows a schematic circuit of a stacked array of embedded electromechanical power switches according to some embodiments.

FIG. 19 illustrates a schematic circuit 1900 of a stacked array of embedded electromechanical power switches, such as for example the array of embedded electromechanical power switches shown in FIG. 15 and FIG. 17. In some embodiments, the stacked array of embedded electromechanical power switches shown in the schematic circuit 1900 is connected in a common-drain/common-source/common-gate configuration. In other embodiments, alternative configurations of the array of embedded electromechanical power switches may be used, for example depending on specific applications requirements. Vertical electrical connections in the stacked array illustrated in the schematic circuit 1900 may be implemented, for example by way of VIAs, as shown in FIG. 6.

Figure 20:
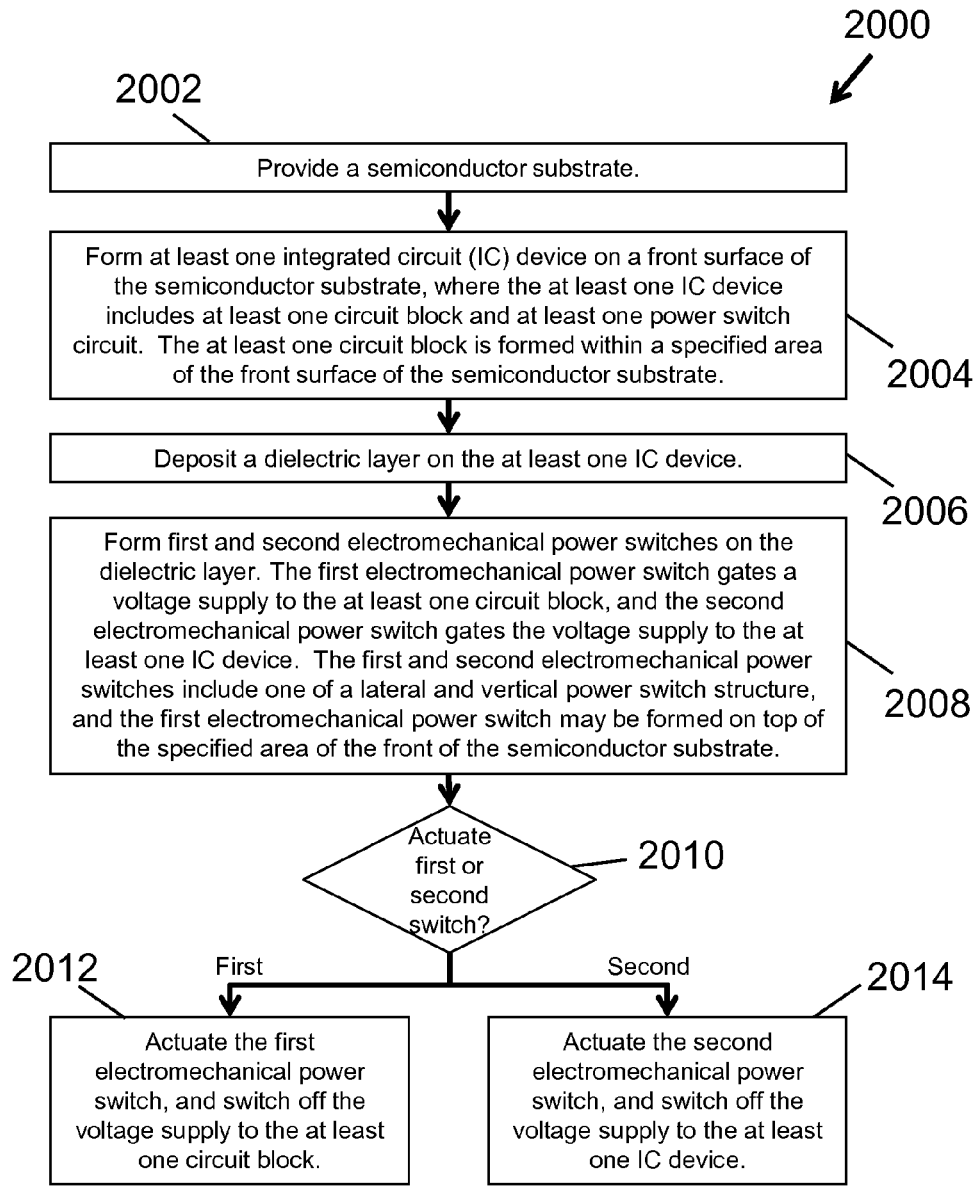
FIG. 20 provides a flowchart of an exemplary process for forming an electromechanical power switch for controlling power to an IC device according to at least one embodiment.

FIG. 20 provides a flowchart of an exemplary process 2000 for forming an electromechanical power switch for controlling power to an IC device according to at least one embodiment. Method 2000 begins by providing a semiconductor substrate (block 2002). At least one IC device is formed on a front surface of the semiconductor substrate (block 2004). The at least one IC device includes at least one circuit block and at least one power switch circuit, and the at least one circuit block is formed within a specified area of the front surface of the semiconductor substrate. A dielectric layer is deposited on the at least one IC device (block 2006), and a first and second electromechanical power switch are formed on the dielectric layer (block 2008). The first electromechanical power switch gates a voltage supply to the at least one circuit block, and the second electromechanical power switch gates the voltage supply to the at least one IC device. In some embodiments, each of the first and second electromechanical power switches may include one of a MEMS power switch and a NEMS power switch. In other embodiments, each of the first and second electromechanical power switches may include one of a lateral power switch structure and a vertical power switch structure, and the first electromechanical power switch may be formed on top of the specified area of the front of the semiconductor substrate. An option to actuate either the first or second electromechanical power switch is presented (block 2010). In some embodiments, the first electromechanical power switch is actuated, and the voltage supply to the at least one circuit block is switched off (block 2012). In other embodiments, the second electromechanical power switch is actuated, and the voltage supply to the at least one IC device is switched off (block 2014).

Figure 21:
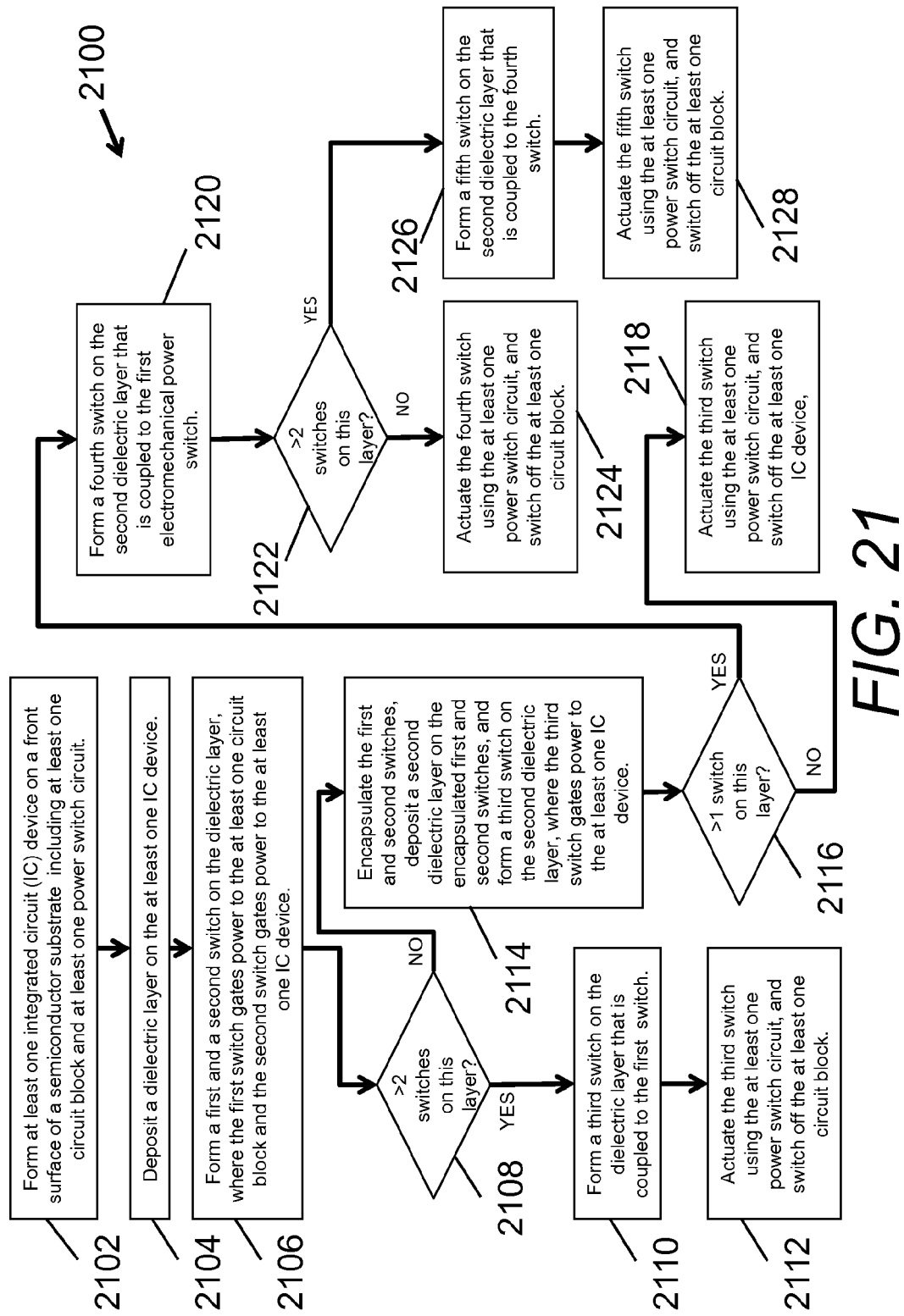
FIG. 21 provides a flowchart of an exemplary process for forming a plurality of electromechanical power switches for controlling power to an IC device according to some embodiments.

FIG. 21 illustrates a flowchart of an exemplary process 2100 for forming a plurality of electromechanical power switches for controlling power to an IC device according to some embodiments. The method 2100 begins by formation of at least one IC device on a front surface of a semiconductor substrate, where the at least one IC device includes at least one circuit block and at least one power switch circuit (block 2102). A dielectric layer is deposited on the at least one IC device (block 2104), and a first and a second electromechanical power switch are formed on the dielectric layer (block 2106). The first electromechanical power switch gates a voltage supply to the at least one circuit block, and the second electromechanical power switch gates the voltage supply to the at least one IC device. In various embodiments, the first and second electromechanical switches are formed horizontally adjacent to one another. At block 2108, it is determined whether to form more than two electromechanical power switches on the dielectric layer. In some embodiments, a third electromechanical power switch is formed on the dielectric layer (block 2110), for example, horizontally adjacent to at least one of the first and second electromechanical switches. Moreover, the third electromechanical power switch is electrically coupled to the first electromechanical power switch in order to provide a higher ON-state current, as compared to the ON-state current provided by a single electromechanical switch, while still able to maintain an OFF-state leakage current near zero. The third electromechanical power switch may be actuated using the at least one power switch circuit (block 2112). Responsive to actuation of the third electromechanical power switch, the at least one circuit block is switched off.

In other embodiments, at block 2108, if no further electromechanical switches are formed on the dielectric layer, the first and second electromechanical switches are encapsulated, and a second dielectric layer is deposited on the encapsulated first and second electromechanical power switches (block 2114). The encapsulation may include, for example, a thin-film encapsulation layer, which provides a stable, hermetic seal for the first and second electromechanical power switches and also provides for continued semiconductor processing over the first and second electromechanical power switches. In various embodiments, a third electromechanical power switch can be formed on the second dielectric layer (block 2114), where the third electromechanical power switch gates the voltage supply to the at least one IC device. At block 2116, it is determined whether to form more than one electromechanical power switch on the second dielectric layer. In some embodiments, no additional electromechanical switches are formed, and the third electromechanical power switch is actuated using the at least one power switch circuit (block 2118). In response to actuating the third electromechanical power switch, the at least one IC device is turned off.

In some embodiments, at block 2116, it is determined that additional electromechanical switches are to be formed on the second dielectric layer, and a fourth electromechanical power switch is formed on the second dielectric layer (block 2120). In some embodiments, the third and fourth electromechanical switches are formed horizontally adjacent to one another. The fourth electromechanical power switch is electrically coupled to the first electromechanical power switch, for example by way of a vertical electrical connection (VIA), in order to provide a higher ON-state current, while still maintaining an OFF-state leakage current near zero. At block 2122, it is determined whether to form more than two electromechanical power switches on the second dielectric layer. In some embodiments, no additional electromechanical switches are formed, and the fourth electromechanical power switch is actuated using the at least one power switch circuit (block 2124). In response to actuating the fourth electromechanical power switch, the at least one circuit block is turned off. In other embodiments, at block 2122, it is determined that additional electromechanical switches are to be formed on the second dielectric layer, and a fifth electromechanical power switch is formed on the second dielectric layer (block 2126). In various embodiments, the fifth electromechanical switch is formed horizontally adjacent to at least one of the third and fourth electromechanical switches. The fifth electromechanical power switch is electrically coupled to the fourth electromechanical power switch in order to provide a higher ON-state current, while still maintaining an OFF-state leakage current near zero. The fifth electromechanical power switch is actuated using the at least one power switch circuit (block 2128). In response to actuating the fifth electromechanical power switch, the at least one circuit block is turned off.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

Furthermore, while the above discussion is meant to be illustrative of the principles and various embodiments of the present invention, numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:

1. A method comprising:
providing a semiconductor substrate;
forming at least one integrated circuit device on a front surface of the semiconductor substrate, wherein the at least one integrated circuit device includes at least one circuit block and at least one power switch circuit;
depositing a dielectric layer on the at least one integrated circuit device;

forming a first electromechanical power switch on the dielectric layer, wherein the first electromechanical power switch gates a voltage supply to the at least one circuit block;

forming a second electromechanical power switch on the dielectric layer, wherein the second electromechanical power switch gates the voltage supply to the at least one integrated circuit device;

actuating the first electromechanical power switch using the at least one power switch circuit; and responsive to actuating the first electromechanical power switch, switching off the voltage supply to the at least one circuit block.

2. The method of claim 1, further comprising:
actuating the second electromechanical power switch using the at least one power switch circuit; and
responsive to actuating the second electromechanical power switch, switching off the voltage supply to the at least one integrated circuit device.

3. The method of claim 1, wherein each of the first and second electromechanical power switches comprises a structure including at least one selected from a group comprising: a lateral power switch structure; and a vertical power switch structure.

4. The method of claim 1, wherein the at least one circuit block is formed within a specified area of the front surface of the semiconductor substrate, and wherein the first electromechanical power switch is formed on top of the specified area of the front surface of the semiconductor substrate.

5. The method of claim 1, further comprising:
forming a third electromechanical power switch on the dielectric layer, wherein the third electromechanical power switch is electrically coupled to the first electromechanical power switch and gates the voltage supply to the at least one circuit block;
actuating the third electromechanical power switch using the at least one power switch circuit; and
responsive to actuating the third electromechanical power switch, switching off the at least one circuit block.

6. The method of claim 1, further comprising:
encapsulating the first and second electromechanical power switches;
depositing a second dielectric layer on the encapsulated first and second electromechanical power switches;
forming a third electromechanical power switch on the second dielectric layer, wherein the third electromechanical power switch gates the voltage supply to the at least one integrated circuit device;
actuating the third electromechanical power switch using the at least one power switch circuit; and
responsive to actuating the third electromechanical power switch, switching off the voltage supply to the at least one integrated circuit device.

7. The method of claim 6, further comprising:
forming a fourth electromechanical power switch on the second dielectric layer, wherein the fourth electromechanical power switch is electrically coupled to the first electromechanical power switch and gates the voltage supply to the at least one circuit block;
actuating the fourth electromechanical power switch using the at least one power switch circuit; and
responsive to actuating the fourth electromechanical power switch, switching off the at least one circuit block.

8. The method of claim 7, wherein the at least one circuit block is formed within a specified area of the front surface of the semiconductor substrate, and wherein the first and fourth electromechanical power switches are formed on top of the specified area of the front surface of the semiconductor substrate.

9. The method of claim 7, further comprising:
forming a fifth electromechanical power switch on the second dielectric layer, wherein the fifth electromechanical power switch is electrically coupled to the fourth electromechanical power switch and gates the voltage supply to the at least one circuit block;
actuating the fifth electromechanical power switch using the at least one power switch circuit; and
responsive to actuating the fifth electromechanical power switch, switching off the at least one circuit block.

10. The method of claim 9, wherein the first, second, third, fourth, and fifth electromechanical power switches each comprise a structure including at least one selected from a group comprising: a lateral power switch structure; and a vertical power switch structure.

11. The method of claim 9, wherein the at least one circuit block is formed within a specified area of the front surface of the semiconductor substrate, and wherein the first, fourth, and fifth electromechanical power switches are formed on top of the specified area of the front surface of the semiconductor substrate.

12. A semiconductor device comprising:
a semiconductor substrate;
at least one integrated circuit device on a front surface of the semiconductor substrate, wherein the at least one integrated circuit device includes at least one circuit block and at least one power switch circuit;
a dielectric layer on the at least one integrated circuit device;
a first electromechanical power switch on the dielectric layer, wherein the first electromechanical power switch gates a voltage supply to the at least one circuit block; and
a second electromechanical power switch on the dielectric layer, wherein the second electromechanical power switch gates a voltage supply to the at least one integrated circuit device;
wherein the first electromechanical power switch is actuated using the at least one power switch circuit, and wherein the at least one circuit block is switched off in response to the first electromechanical power switch being actuated.

13. The semiconductor device of claim 12, wherein the second electromechanical power switch is actuated using the at least one power switch circuit, and wherein the at least one integrated circuit device is switched off in response to the second electromechanical power switch being actuated.

14. The semiconductor device of claim 12, wherein the at least one circuit block is formed within a specified area of the front surface of the semiconductor substrate, and wherein the first electromechanical power switch is formed on top of the specified area of the front surface of the semiconductor substrate.

15. The semiconductor device of claim 12, further comprising:
a third electromechanical power switch on the dielectric layer, wherein the third electromechanical power switch is electrically coupled to the first electromechanical power switch and gates the voltage supply to the at least one circuit block;
wherein the third electromechanical power switch is actuated using the at least one power switch circuit, and wherein the at least one circuit block is switched off in response to the third electromechanical power switch being actuated.

16. The semiconductor device of claim 12, further comprising:
the first and second electromechanical power switches on the dielectric layer, wherein the first and second electromechanical power switches are encapsulated;
a second dielectric layer on the encapsulated first and second electromechanical power switches; and
a third electromechanical power switch on the second dielectric layer, wherein the third electromechanical power switch gates the voltage supply to the at least one integrated circuit device;
wherein the third electromechanical power switch is actuated using the at least one power switch circuit, and wherein the at least one integrated circuit device is switched off in response to the third electromechanical power switch being actuated.

17. The semiconductor device of claim 16, further comprising:
a fourth electromechanical power switch on the second dielectric layer, wherein the fourth electromechanical power switch is electrically coupled to the first electromechanical power switch and gates the voltage supply to the at least one circuit block;
wherein the fourth electromechanical power switch is actuated using the at least one power switch circuit, and wherein the at least one circuit block is switched off in response to the fourth electromechanical power switch being actuated.

18. The semiconductor device of claim 17, further comprising:
a fifth electromechanical power switch on the second dielectric layer, wherein the fifth electromechanical power switch is electrically coupled to the fourth electromechanical power switch and gates the voltage supply to the at least one circuit block;
wherein the fifth electromechanical power switch is actuated using the at least one power switch circuit, and wherein the at least one circuit block is switched off in response to the fifth electromechanical power switch being actuated.

19. A data processing system comprising:
a system bus;
at least one interface device in communication with the system bus;
a power management unit in communication with the system bus;
a first electromechanical power switch in communication with the power management unit;
a second electromechanical power switch in communication with the power management unit; and
at least one circuit block in communication with the first electromechanical power switch;
wherein the first electromechanical power switch gates a voltage supply to the at least one circuit block and the second electromechanical power switch gates a voltage supply to the data processing system; and
wherein the first electromechanical power switch is actuated by the power management unit, and wherein the at least one circuit block is switched off in response to the first electromechanical power switch being actuated.

20. The data processing system of claim 19, wherein the second electromechanical power switch is actuated using the power management unit, and wherein the data processing system is switched off in response to the second electromechanical power switch being actuated.

* * * * *